US006111805A

United States Patent [19]

Furutani

[11] Patent Number: 6,111,805

[45] Date of Patent: Aug. 29, 2000

[54] POWER-ON-RESET CIRCUIT FOR GENERATING A RESET SIGNAL TO RESET A DRAM

[75] Inventor: Kiyohiro Furutani, Hyogo, Japan

[73] Assignee: Mitsubishi Denki Kabushiki Kaisha, Tokyo, Japan

[21] Appl. No.: 09/195,688

[22] Filed: Nov. 19, 1998

[30] Foreign Application Priority Data

Jun. 5, 1998 [JP] Japan .................................. 10-157474

[51] Int. Cl.[7] ........................................ G11C 7/00

[52] U.S. Cl. ...................................... 365/226; 365/189.09

[58] Field of Search .................................. 365/226, 227, 365/228, 229, 189.09

[56] References Cited

U.S. PATENT DOCUMENTS

| | | | |
|---|---|---|---|
| 5,278,792 | 1/1994 | Inoue et al. | 365/226 |
| 5,436,586 | 7/1995 | Miyamoto | 365/226 |
| 5,652,730 | 7/1997 | Kono et al. | 365/226 |
| 5,703,804 | 12/1997 | Takata et al. | 365/226 |
| 5,870,342 | 2/1999 | Fukuda | 365/226 |

OTHER PUBLICATIONS

"A 4Mb Pseudo SRAM Operating at 2.6+−1V With 3uA Data Retention Current", K. Sato et al., 1991 IEEE International Solid–State Circuits Conference pp. 268–269.

*Primary Examiner*—Richard Elms
*Assistant Examiner*—VanThu Nguyen
*Attorney, Agent, or Firm*—McDermott, Will & Emery

[57] ABSTRACT

In a signal generating circuit generating a reset signal for resetting a DRAM at the time of turning on the power supply potential, a resistance element is connected between a line of the power supply potential and a node, and two N channel MOS transistors constituting a discharge circuit are connected in series between the node and a line of a ground potential. When the power supply potential is lower than a prescribed potential, the two N channel MOS transistors are rendered non-conductive so that the node attains to the "H" level, and when the power supply potential is higher than the prescribed potential, the two N channel MOS transistors are rendered conductive so that the node attains to the "L" level. Therefore, even when the power supply potential changes moderately, the level of the reset signal changes abruptly, surely resetting the DRAM.

6 Claims, 26 Drawing Sheets

Tc1
T1
Ts
T1
T1
Tw
T1

WL
BL
POSITION A
/BL
CSL
CSL

WL
BL
POSITION B
/BL
CSL

WL
BL
POSITION C
/BL
CSL
CSL
TIME t

FIG. 28 PRIOR ART
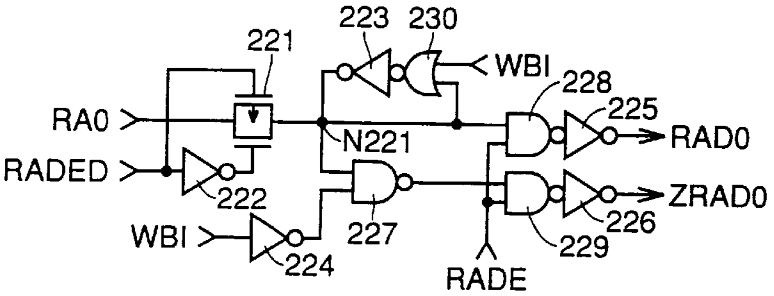
FIG. 29A PRIOR ART
FIG. 29B PRIOR ART
FIG. 29C PRIOR ART
FIG. 29D PRIOR ART
FIG. 29E PRIOR ART
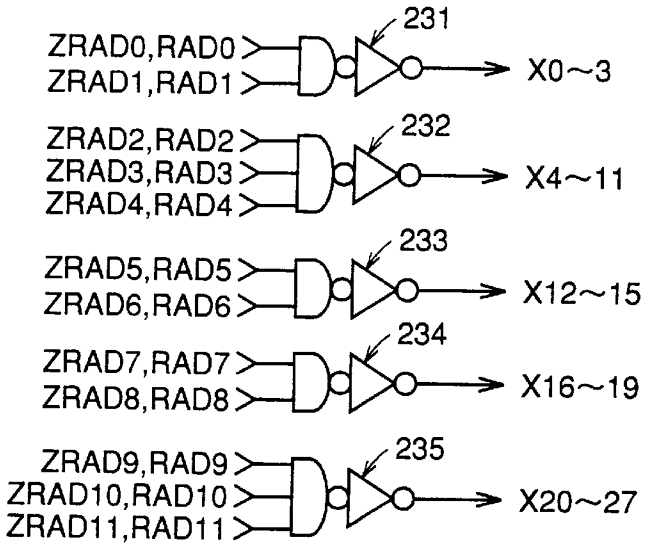
FIG. 30 PRIOR ART
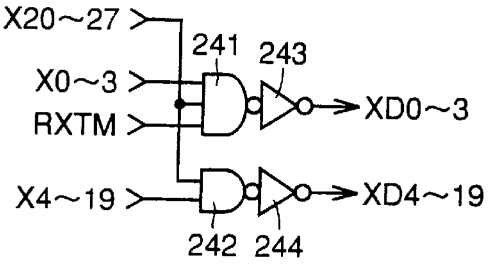

POWER-ON-RESET CIRCUIT FOR GENERATING A RESET SIGNAL TO RESET A DRAM

BACKGROUND OF THE INVENTION

1. Field of the Invention

The present invention relates to a semiconductor memory device, and more particularly, it relates to a semiconductor memory device controlled by external control signals.

2. Description of the Prior Art

FIG. 16 illustrates the layout of a conventional dynamic random access memory (hereinafter referred to as DRAM).

Referring to FIG. 16, this DRAM comprises a rectangular semiconductor substrate 100 and memory mats MM1 to MM4 provided on four corners of the semiconductor substrate 100 respectively. Each memory mat MM includes a plurality of (nine in FIG. 16) sense amplifier zones SA1 to SA9 and memory arrays MA1 to MA8 arranged between the sense amplifier zones SA1 to SA9 respectively. A row decoder RD and a column decoder CD are provided in correspondence to each memory mat MM. A column selection line CSL is provided across the sense amplifier zones SA1 to SA9 and the memory arrays MA1 to MA8 of each memory mat MM. An end of the column selection line CSL is connected to the column decoder CD. Word lines WL are provided in each memory array MA to perpendicularly intersect with the column selection line CSL, and first ends of the word lines L are connected to the row decoder RD.

A plurality of input buffers 101 and a control circuit 102 are provided on the region between the memory mats MM1 to MM4. The control circuit 102 generates various internal signals in response to various signals externally supplied through the plurality of input buffers 101, and supplies the internal signals to each row decoder RD and each column decoder CD through signal lines SL1 to SL4.

The signal line SL1 is provided in correspondence to each of a row decoder activation signal RXTM, a row decoder reset signal ZXRSTM, a sense amplifier inactivation signal ZSRSTM and sense amplifier activation signals SONM and SOPM. The signal line SL2 is provided in correspondence to each of predecode signals X0 to X27. The signal line SL3 is provided in correspondence to each of predecode signals Y0 to Y27. The signal line SL4 is provided in correspondence to a column decoder activation signal CDE. While the signal lines SL1, SL2 and SL3 are provided in plural respectively, FIG. 16 shows only single ones thereof for simplifying the illustration.

The control circuit 102 is arranged at the center of the semiconductor substrate 100, for equalizing the wiring lengths between the control circuit 102 and the four row decoders RD1 to RD4 as well as those between the control circuit 102 and the four column decoders CD1 to CD4 with each other.

FIG. 17 is a circuit block diagram showing the structures of the memory array MA1 and the sense amplifier zone SA1 shown in FIG. 16.

Referring to FIG. 17, the memory array MA1 includes a plurality of memory cells MC arranged in rows and columns, word lines WL provided in correspondence to the respective rows, and bit line pairs BL and /BL provided in correspondence to the respective columns. The memory cell MC is well-known one including access transistor and capacitor for storing information. The word line WL transmits an output of the row decoder RD and activates the memory cells MC of selected row. The bit line pair BL and /BL input/output data signal in/from the selected memory cell MC.

The sense amplifier zone SA1 has a pair of data input/output lines IO and /IO, column selector gates 103, sense amplifiers 104 and equalizers 105. Column selector gate 103, sense amplifier 104 and equalizer is provided in correspondence to the respective columns of the memory array MA1.

Each column selector gate 103 includes a pair of N-channel MOS transistors connected between the bit line pair BL and /BL of the corresponding column and the pair of data input/output lines IO and /IO. A gate of the N-channel MOS transistor is connected to the column decoder CD through the column selection line CSL for the corresponding column. When the column decoder CD sets the column selection line CSL high for selection, the N-channel MOS transistors conduct to connect the bit line pair BL and /BL with the data input/output line pair IO and /IO.

The sense amplifier 104 responsively amplifies small potential difference between the bit lines BL and /BL to a power supply voltage Vcc when sense amplifier activation signals SON and ZSOP go high and low respectively. The equalizer 105 responsively equalizes the potentials of the bit lines BL and /BL with a bit line potential VBL when a bit line equalize signal BLEQ goes high for activation.

The row decoder RD generates the control signals SON, ZSOP and BLEQ in accordance with predecode signals X0 to X23 and the control signals RXTM, ZSRSTM and ZXRSTM from the control circuit 102 and sets one of the plurality of word lines WL high for selection. The column decoder CD sets one of the plurality of column selection lines CSL high for selection in accordance with the predecode signals Y0 to Y19 and the control signal CDE from the control circuit 102.

In a write mode, the column decoder CD sets the column selection line CSL for the column responsive to the predecode signals Y0 to Y27 high for activation and makes the column selector gate 103 conduct. Externally supplied write data is supplied to the bit line pair BL and /BL for the selected column through the data input/output line pair IO and /IO. This write data is supplied as the potential difference between the bit lines BL and /BL. Then, the row decoder RD sets the word line WL of the row responsive to the predecode signals X0 to X27 high for selection and activates the memory cells MC of this row. Capacitor of the selected memory cell MC stores charges in a quantity responsive to the potential of the bit line BL or /BL.

In a read mode, the bit line equalize signal BLEQ first falls to a low level for inactivation, and the equalizer 105 is inactivated to stop equalization of the bit lines BL and /BL. The row decoder RD sets the word line WL for the row corresponding to the predecode signals X0 to X27 high for selection. The potentials of the bit lines BL and /BL slightly change in response to the quantity of charges stored in the activated memory cells MC.

Then, the sense amplifier activation signals SON and ZSOP go high and low respectively, for activating the sense amplifier 104. If the potential of the bit line BL is slightly higher than that of the bit line /BL, the former and the latter are pulled up and down to high and low levels respectively. If the potential of the bit line /BL is slightly higher than that of the bit line BL, on the other hand, the former and the latter are pulled up and down to high and low levels respectively.

Then, the column decoder CD sets the column selection line CSL for the column corresponding to the predecode signals Y0 to Y27 high for selection and makes the column selector gate 103 of this column conduct. The data of the bit line pair BL and /BL for the selected column is outputted to the exterior through the column selector gate 103 and the data input/output line pair IO and /IO.

A row selection method of this DRAM is now described in detail. As shown in FIG. 18, the plurality of input buffers 101 are provided in correspondence to external control signals ext./RAS, ext./CAS, ext./WE and ext./CS, external address signals ext.A0 to ext.A12, external bank address signals ext.BA0 and ext.BA1 and an external clock signal ext.CLK respectively.

Each input buffer 101 includes a differential amplifier 115 formed by P-channel MOS transistors 111 and 112 and N-channel MOS transistors 113 and 114 and a buffer 118 formed by two invertors 116 and 117. The differential amplifier 115 compares the level of the corresponding external signal (e.g., ext./RAS) with a reference potential Vref and responsively outputs a low-level signal when the level of the external signal ext./RAS drops below the reference potential Vref. The buffer 118 receives an output signal of the differential amplifier 115 and supplies this signal to the control circuit 102 as an internal signal int./RAS.

FIGS. 19 and 20 are circuit diagrams showing the structures of signal generation circuits 120, 130.1 to 130.4, 142.1, 142.2 and 146.1 to 146.13 included in the control circuit 102.

The signal generation circuit 120 includes a delay circuit 122 formed by odd stages of (five in FIG. 19) invertors 121 and an AND gate 125 formed by a NAND gate 123 and an invertor 124. The internal clock signal int.CLK is inputted in a first input node of the AND gate 125 through the delay circuit 122 and directly inputted in a second input node of the AND gate 125. The AND gate 125 outputs a clock signal CLK. As shown in FIGS. 21B and 21C, the clock signal CLK goes high only for a prescribed time from the leading edge of the internal clock signal int.CLK. The clock signal CLK is supplied to each of the signal generation circuits 130.1 to 130.4, 142.1, 142.2 and 146.1 to 146.13.

The signal generation circuits 130.1 to 130.4 are provided in correspondence to internal control signals int./RAS, int./CAS, int./WE and int./CS respectively. The signal generation circuit 130.1 includes a transfer gate 131, an invertor 132, a latch circuit 136 and a gate circuit 141. The transfer gate 131 has a first conducting electrode receiving the corresponding internal control signal int./RAS, a P-channel MOS transistor side gate receiving the clock signal CLK and an N-channel MOS transistor side gate receiving an inversion signal (output of the invertor 132) of the clock signal CLK. The transfer gate 131 conducts when the clock signal CLK is at a low level and supplies the internal control signal int./RAS to the latch circuit 136. The latch circuit 136, including invertors 133 to 135, latches the signal supplied from a second conducting electrode of the transfer gate 131 and an inversion signal thereof and supplies these signals to the gate circuit 141.

The gate circuit 141 includes NAND gates 137 and 138 and invertors 139 and 140. First input nodes of the NAND gates 137 and 138 receive the clock signal CLK, while second input nodes thereof receive the inversion output signal and the output signal of the latch circuit 136 respectively. Output signals of the NAND gates 137 and 138 are inputted in the invertors 139 and 140 respectively. The invertors 139 and 140 output signals RAS0 and ZRAS0 respectively. As shown in FIGS. 21A to 21G, the gate circuit 141 conducts and the signals RAS0 and ZRAS0 go high and low respectively when the clock signal CLK is at a high level, while the output signals RAS0 and ZRAS0 of the gate circuit 141 are fixed at low levels when the clock signal CLK is at a low level.

The signal generation circuits 130.2 to 130.4 are similar to the signal generation circuit 130.1. The signal generation circuits 130.2 to 130.4 output signals CAS0 and ZCAS0, WE0 and ZWE0, and CS0 and ZCS0 respectively.

The signal generation circuits 142.1 and 142.2 are provided in correspondence to internal bank address signals int.BA0 and int.BA1 respectively. The signal generation circuit 142.1 is different from the signal generation circuit 130.1 only in a point that a flip-flop 145 formed by NAND gates 143 and 144 is newly provided. The flip-flop 145 is set by an output of a NAND gate 137 and reset by that of a NAND gate 138, for outputting signals BAD0 and ZBAD. Invertors 139 and 140 output signals BA0.0 and ZBA0.0 respectively.

The signal generation circuit 142.2 is similar to the signal generation circuit 142.1. This signal generation circuit 142.2 outputs signals BAD1, ZBAD1, BA0.1 and ZBA0.1.

The signal generation circuits 146.1 to 146.13 are provided in correspondence to internal address signals int.A0 to int.A12 respectively. Each of the signal generation circuits 146.1 to 146.13 is different from the signal generation circuit 142.1 in a point that no invertors 139 and 140 are provided. The signal generation circuits 146.1 to 146.13 output signals AD0 and ZAD0, . . . , AD12 and ZAD12 respectively.

The signals RAS0 and ZRAS0, . . . , CAS0 and ZCAS0 generated in the signal generation circuits 130.1 to 130.4 shown in FIG. 19 are supplied to an instruction decoder 150 shown in FIG. 22. The instruction decoder 150 includes four-input NAND gates 151 to 156 provided in correspondence to row activation instruction signals ZACTF and ZPRE, an interruption instruction signal ZTERM, an automatic refresh operation start instruction signal ZAUTOREF, a read burst operation start instruction signal ZREAD and a write burst operation start instruction signal ZWRITE respectively.

When the signals CS0, RAS0, ZCAS0 and ZWE0 go high, the output of the NAND gate 151, i.e., the row activation instruction signal ZACTF goes low for activation. When the signals CS0, RAS0, ZCAS0 and WE0 go high, the output of the NAND gate 152, i.e., the row activation instruction signal ZPRE goes low for activation. When the signals CS0, ZRAS0, ZCAS0 and WE0 go high, the output from the NAND gate 153, i.e., the interruption instruction signal ZTERM for a write/read burst operation goes low for activation.

When the signals CS0, RAS0, CAS0 and ZWE0 go high, the automatic refresh operation start instruction signal ZAUTOREF outputted from the NAND gate 154 goes low for activation. When the signals CS0, ZRAS0, CAS0 and ZWE0 go high, the read burst operation start instruction signal ZREAD outputted from the NAND gate 155 goes low for activation. When the signals CS0, ZRAS0, CAS0 and WE0 go high, the write burst operation start instruction signal ZWRITE outputted from the NAND gate 156 goes low for activation.

FIG. 23 is a circuit diagram showing the structure of a signal generation circuit for generating a row activation signal ZRASE.

Referring to FIG. 23, this signal generation circuit includes a resistive element 157, a capacitor 158, NAND gates 161 to 163, NOR gates 165 to 167 and an invertor 168, and the NAND gates 162 and 163 form a flip-flop 164.

The resistive element 157and the capacitor 158 are connected between lines of a power supply potential Vcc and a ground potential GND. A node N 157 between the resistive element 157 and the capacitor 158 outputs a signal ZPOR for initializing the circuit upon power supply. The signal ZPOR is inputted in a first reset terminal 164a of the flip-flop 164.

The NAND gate 161 receives the signals BA0.0 and BA0.1. The NOR gate 165 receives an output of the NAND gate 161 and the signal ZACTF. The NOR gate 166 receives a signal ACTS and an output of the NOR gate 165, while an output thereof is inputted in a set terminal 164*c* of the flip-flop 164. The NOR gate 167 receives the output of the NAND gate 161 and a signal ZPREC, while an output thereof is inputted in a second reset terminal 164*b* of the flip-flop 164 through the invertor 168. An inversion output of the flip-flop 164 forms the row activation signal ZRASE.

FIG. 24 is a circuit diagram showing the structure of a signal generation circuit for generating various control signals in response to the row activation signal ZRASE.

Referring to FIG. 24, this signal generation circuit includes NAND gates 171 to 173, a NOR gate 174, delay circuits 175 to 179 and invertors 180 to 185. The row activation signal ZRASE is directly inputted in first input nodes of the NAND gates 171 and 172 and inputted in a second input node of the NAND gate 172 through the delay circuit 175 formed by two invertors. An output of the NAND gate 172 is delayed by the invertors 181 and 182, to form the row decoder reset signal ZXRSTM.

The output of the NAND gate 172 is directly inputted in a first input node of the NOR gate 174 and inputted in a second input node of the NOR gate 174 through the invertor 181 and the delay circuit 177 formed by five invertors. An output of the NOR gate 174 is inverted by the invertor 183, to form the sense amplifier inactivation signal ZSRSTM.

The signal ZSRSTM is inputted in a second input node of the NAND gate 171 through the invertor 180. An output of the NAND gate 171 forms a row address buffer activation signal RADE. The signal RADE is delayed by the delay circuit 176 formed by two invertors, to form a signal RADED.

The signal ZSRSTM is delayed by the delay circuit 178 formed by four invertors, to form the sense amplifier activation signal SONM. The signal ZSRSTM is further inputted in a first input node of the NAND gate 173 through the delay circuit 179 formed by four invertors. The row activation signal ZRASE is inputted in a second input node of the NAND gate 173 through the invertor 184. An output of the NAND gate 173 is inverted by the invertor 185, to form the row decoder activation signal RXTM.

FIGS. 25A to 25M are timing charts showing operations of the circuits shown in FIGS. 22 to 24.

Referring to FIGS. 25A to 25M, a row access instruction (ACT instruction) has prescribed set-up and holding times, and is applied in synchronization with the leading edge of the external clock signal ext.CLK. At this time, the automatic refresh activation signal ACTS is at a low level, while the signals ZPREC and ZPOR are at high levels. The ACT instruction is issued by setting the external control signals ext./CS, ext./RAS, ext./CAS and ext./WE low, low, high and high respectively.

When the ACT instruction is issued and both of the external bank address signals ext.BA0 and ext.BA1 specifying a bank for vow access go low, the signals ZACTF, BA0.0 and BA0.1 go low, high and high respectively while the clock signal CLK is at a high level. Thus, the flip-flop 164 is set and the signal ZRAS falls to a low level for activation, and the signals RADE, RADED, ZXRSTM, ZSRTSM, SONM and RXTM go high in response.

A row access end instruction (PRE instruction) is issued by setting the external control signals ext./CS, ext./RAS, ext./CAS and ext./WE low, low, high and low respectively. At this time, the signals ACTS, ZACTF and ZPOR are at low, high and high levels respectively.

When the PRE instruction is issued and the external bank address signals ext.BA0 and ext.BA1 go low, the signals PREC, BA0.0 and BA0.1 go low, high and high respectively while the clock signal CLK maintains the high level. Thus, the flip-flop 164 is reset and the signal ZRASE goes high for inactivation, so that the signals RADE, RADED, ZXRSTM, ZSRSTM, SONM and RXTM go low in response.

FIG. 26 is a circuit diagram showing the structure of a signal generation circuit for decoding the signals SONM, SOPM, ZSRSTM and ZXRSTM by a block decode signal Xn (n: integer of 20 to 27) and generating the signals BLEQ, SON, ZSOP and ZXRST.

This signal generation circuit is provided in correspondence to each sense amplifier zone SA. The signal SOPM is obtained by delaying the signal SONM (see FIG. 2). Referring to FIG. 26, the signal generation circuit includes NAND gates 190 to 193, NOR gates 194 and 195, invertors 196 to 200, P-channel MOS transistors 201 and 202 and N-channel MOS transistors 203 to 205.

When both of the signals Xn and ZSRSTM go high, an output of an AND gate formed by the NAND gate 190 and the invertor 196, i.e., the bit line equalize signal BLEQ goes high.

When one of the signal Xn and a signal Xn+1 goes high and the signal ZSRSTM goes high, outputs of the invertor 197 and the NOR gate 194 go low, while that of the NOR gate 195 goes high. At this time, the NAND gates 191 and 192 operate as invertors for the signals SONM and SOPM respectively. The signal SONM is delayed by the NAND gate 191 and the invertor 198, to form the signal SON. The signal SOPM is delayed by the NAND gate 192 and the invertors 199 and 200, to form the signal ZSOP.

When the signals Xn and ZXRSTM go high, the N-channel MOS transistors 203 and 204 conduct, the NAND gate 193 outputs a low level and the N-channel MOS transistor 205 enters a non-conducting state. Thus, the P-channel MOS transistors 201 and 202 enter non-conducting and conducting states respectively, and the signal ZXRST goes high. When at least one of the signals Xn and ZXRSTM goes low, the signal ZXRST goes low.

FIG. 27 is a circuit diagram showing the structure of a switching circuit for switching an address signal (e.g., AD0) generated in accordance with an external address signal and a refresh address signal (e.g., Q0) generated in the interior of the DRAM chip.

Referring to FIG. 27, the switching circuit includes clocked invertors 211 and 212 and invertors 213 to 217, and the invertors 216 and 217 form a latch circuit 218. The signal ZACTF is inverted by the invertor 213, to form a signal ZRAL for incorporating the external address signal. A signal ZQAL for incorporating the refresh address signal Q0 goes high when the automatic refresh signal ZAUTOREF goes low.

When the signals ZRAL and ZQAL go high and low respectively, the clocked invertor 211 is activated and the address signal AD0 is latched by the latch circuit 218, to form a signal RA0. When the signals ZRAL and ZQAL go low and high respectively, on the other hand, the docked invertor 212 is activated and the address signal Q0 is latched by the latched circuit 218, to form the signal RA0.

FIG. 28 is a circuit diagram showing the structure of an address buffer. Referring to FIG. 28, this address buffer includes a transfer gate 221, invertors 222 to 226, NAND gates 227 to 229 and a NOR gate 230.

When a burn-in test signal WBI is at a low level for inactivation, each of the NAND gate 227 and the NOR gate 230 operates as an invertor for an input. The transfer gate 221 conducts so that the address signal RA0 is incorporated in a node N221 while the signal RADED is at a low level. A latch circuit formed by the invertor 223 and the NOR gate 230 latches the level of the node N221.

While the signal RADE is at a high level, the NAND gates 228 and 229 operate as invertors for inputs. The address signal RA0 incorporated in the node N221 is delayed by the NAND gate 228 and the invertor 225, to form an address signal RAD0. The address signal RA0 incorporated in the node N221 is further delayed by the NAND gates 227 and 229 and the invertor 226, to form an address signal ZRAD0. When the burn-in test signal WBI is at a high level for activation, the node N221 is fixed at a high level and the address signals RAD0 and ZRAD0 can be generated with no input of the address signal RA0.

FIGS. 29A to 29E are circuit diagrams showing the structure of a predecoder. Referring to FIGS. 29A to 29E, this predecoder includes AND gates 231 to 235 formed by NAND gates and invertors. The AND gate 231 is provided in correspondence to each of the signals X0 to X3. Two of the signals ZRAD0, RAD0, ZRAD1 and RAD 1 are previously assigned to each AND gate 231. Each AND gate 231 responsively sets the corresponding signal X high when the previously assigned signals go high.

Similarly, signals X4 to X11 are generated from signals ZRAD2, RAD2 to ZRAD4 and RAD4. Signals X12 to X15 are generated from signals ZRAD5, RAD5, ZRAD6 and RAD6. Signals X16 to X19 are generated from signals ZRAD7, RAD7, ZRAD8 and RAD8. Signals X20 to X27 are generated from signals ZRAD9, RAD9 to ZRAD11 and RAD11.

FIG. 30 is a circuit diagram showing the structure of a signal generation circuit for decoding the signals X0 to X19 with block signals X20 to X27 and generating local signals XD0 to XD19.

Referring to FIG. 30, this signal generation circuit includes NAND gates 241 and 242 and invertors 243 and 244. The signal generation circuit is provided in correspondence to each block. When the signal X (e.g., X20) for selecting the corresponding block as well as the row decoder activation signal RXTM also go high, each of the NAND gates 241 and 242 operates as an invertor for input signals.

The NAND gate 241 and the invertor 243 are provided in correspondence to each of the signals X0 to X3. The NAND gate 242 and the invertor 244 are provided in correspondence to each of the signals X4 to X19. Each of the signals X0 to X3 is delayed by the corresponding NAND gate 241 and the corresponding invertor 243, to form each of signals XD0 to XD3. Each of the signals X4 to X19 is delayed by the corresponding NAND gate 242 and the corresponding invertor 244, to form each of signals XD4 to XD19.

FIG. 31 is a circuit diagram showing the structure of a word line drive circuit for selecting each word line WL in response to the address signals XD0 to XD19.

Referring to FIG. 31, this word line drive circuit includes a NAND gate 251, an N-channel MOS transistor 258, P-channel MOS transistors 259 and 260 and an invertor 261.

The NAND gate 251 includes P-channel MOS transistors 252 to 254 connected in parallel between lines of the power supply potential Vcc and an output node 251*a* and N-channel MOS transistors 255 to 257 serially connected between the output node 251*a* and a line of the ground potential GND. Gates of the MOS transistors 252 and 257 are connected in common for receiving a signal (e.g., XD16) previously assigned to the corresponding word line WL among the address signals XD16 to XD19. Gates of the MOS transistors 253 and 256 are connected in common for receiving a signal (e.g., XD12) previously assigned to the corresponding word line WL among the address signals XD12 to XD15. Gates of the MOS transistors 254 and 255 are connected in common for receiving a signal (e.g., XD4) previously assigned to the corresponding word line WL among the address signals XD12 to XD15.

When the previously assigned signals XD16, XD12 and XD4 go high, the P-channel MOS transistors 252 to 254 and the N-channel MOS transistors 255 to 257 enter non-conducting and conducting states respectively, and the output node 251*a* goes low.

The N-channel MOS transistor 258 is connected between the output node 251*a* of the NAND gate 251 and an input node 261*a* of the invertor 261 for receiving a signal (e.g., XD0) previously assigned to the corresponding word line WL among the address signals XD0 to XD3 in the gate thereof. When the previously assigned signal XD0 goes high, the N-channel MOS transistor 258 conducts to connect the output node 251*a* of the NAND gate 251 with the input node 261*a* of the invertor 261.

The P-channel MOS transistor 259 is connected between a line of the power supply potential Vcc and the input node 261*a* of the invertor 261, for receiving the row decoder reset signal ZXRST in the gate thereof. When the signal ZXRST goes low for activation, the P-channel MOS transistor 259 conducts to reset the node 261*a* at a high level.

The P-channel MOS transistor 260 is connected between a line of a step-up potential Vpp and the input node 261*a* of the invertor 261, and has a gate connected to an output node 261*b* of the invertor 261. When the input and output nodes 261*a* and 261*b* of the invertor 261 go high and low respectively, the P-channel MOS transistor 260 conducts and the input node 261*a* is latched at the high level. However, the gate width of the P-channel MOS transistor 260 is set smaller than those of the N-channel MOS transistors 255 to 258, and hence the input node 261*a* goes low when the N-channel MOS transistors 255 to 258 conduct.

The invertor 261 includes a P-channel MOS transistor 262 which is connected between a line of the power supply potential Vcc and the output node 261*b* and has a gate connected to the input node 261*a* and an N-channel MOS transistor 263 which is connected between the output node 261*b* and a line of the ground potential GND and has a gate connected to the input node 261*a*. The output node 261*b* of the invertor 261 is connected to the corresponding word line WL. When the input node 261*a* goes low, the P-channel and N-channel MOS transistors 262 and 263 enter conducting and non-conducting states respectively and the corresponding word line WL goes high for selection. Thus, an N-channel MOS transistor Q included in each memory cell MC connected to the word line WL conducts and a capacitor C included in the memory cell MC is connected with the bit line BL or /BL, to enable data reading/writing.

In the conventional DRAM having the aforementioned structure, the chip area increases following increase of the storage capacity of the DRAM, the lengths of signal lines increase and the operating speed-is retarded when the number of signals increases.

SUMMARY OF THE INVENTION

Accordingly, an object of the present invention is to provide a semiconductor memory device having a high operating speed.

In a semiconductor memory device according to an aspect of the present invention, each of memory arrays provided on four corners of a semiconductor substrate is split into at least two memory blocks, a row decoder is provided in correspondence to each memory block of each memory array, a column decoder is provided between at least two memory blocks of each memory array, and a signal transmission circuit is provided in the vicinity of each column decoder. A control circuit provided at the center of the semiconductor substrate supplies a row selection signal and a column selection signal to each row decoder and each column decoder through each signal transmission circuit. Among word lines and column selection lines, therefore, those located close to the column decoder are first selected while those far from the column decoder are finally selected. Therefore, a wasteful standby time is reduced by adjusting the timing for selecting the word lines and the column selection lines on a position close to the column decoder.

In a semiconductor memory device according to another aspect of the present invention, a first signal generation circuit outputs an AND signal of first and second external control signals and a complementary signal thereof, a second signal generation circuit outputs the second external control signal and a complementary signal thereof, a third signal generation circuit outputs a third external control signal and a complementary signal thereof, and an AND circuit responsively outputs an internal control signal when three signals previously assigned one by one from the first to third signal generation circuits are activated. Therefore, increase of a delay time in reduction of a power supply voltage is suppressed as compared with the prior art employing a four-input AND circuit.

A semiconductor memory device according to still another aspect of the present invention includes a first instruction decoder outputting an internal control signal in response to a plurality of external control signals, a latch circuit latching the plurality of external control signals, a second instruction decoder outputting an internal control signal in response to the plurality of external control signals latched by the latch circuit, and an internal circuit responsively performing a prescribed operation when at least one of the first and second instruction decoders outputs the internal control signal. Thus, the internal control signal, which is generated from the external control signals not yet latched, is promptly generated. Further, the internal control signal, also generated from the latched external control signals, is outputted even if the external control signals change.

A semiconductor memory device according to a further aspect of the present invention is provided with a flip-flop which is set by an access start instruction signal for outputting a first signal, reset by an access end instruction signal for outputting a second signal or reset upon power supply for outputting the second signal and access means responsively starting access to a memory cell array when supplied with at least one of the access start instruction signal and the first signal. Therefore, the access time is reduced as compared with the prior art having access means starting access in response to only a first signal.

Preferably, the flip-flop includes a first AND gate receiving the access start instruction signal and a second AND gate receiving the access end instruction signal, and the threshold voltage of the first AND gate is lower than that of the second AND gate. In this case, the flip-flop is easy to reset upon power supply.

Further preferably, the semiconductor memory device is, further provided with a capacitor connected between an output node of the first AND gate and a line of a reference potential. In this case, the output node of the first AND gate hardly goes high and the flip-flop is easy to reset upon power supply.

A semiconductor memory device according to a further aspect of the present invention includes a resistive element for charging a first node to the power supply potential, a discharge circuit connected between the first node and a line of a ground potential for responsively conducting when the potential of the first node exceeds a predetermined level, a logic circuit responsively outputting a reset signal when the potential of the first node is higher than a predetermined level, an RC filter, and a transistor connected between a second node which is an output node of the RC filter and the first node for conducting when the power supply potential drops below the level of the second node. Therefore, the reset signal is outputted no matter whatever the power supply potential loosely changes or the power supply potential abruptly reduces.

According to a further aspect of the present invention, a decoder includes an input node receiving a first address signal, an output node, and first to N−1-th transistors serially connected between the input node and the output node for conducting in response to supply of second to N-th address signals respectively. In this case, the number of the address signals can be reduced as compared with the prior art having an input node fixed at the ground potential, thereby attaining reduction of the layout area.

Preferably, a signal generation circuit outputting an inactivation level signal in a period other than a test mode while stopping output of the inactivation level signal in the test mode, and an N-th transistor connected between an output node of the signal generation circuit and that of the decoder for responsively conducting when a corresponding memory cell selection line enters a selection level. In this case, the current suppliability of a driver for the first address signal can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 28 is a circuit diagram showing the structure of a signal generation circuit for generating a signal RAD etc. in the DRAM shown in FIG. 16;

FIGS. 29A to 29E are circuit diagrams showing the structure of a predecoder of the DRAM shown in FIG. 16;

FIG. 30 is a circuit diagram showing the structure of a signal generation circuit for generating a signal XD in the DRAM shown in FIG. 16.

DESCRIPTION OF THE PREFERRED EMBODIMENTS

[Embodiment 1]

Figure 1:
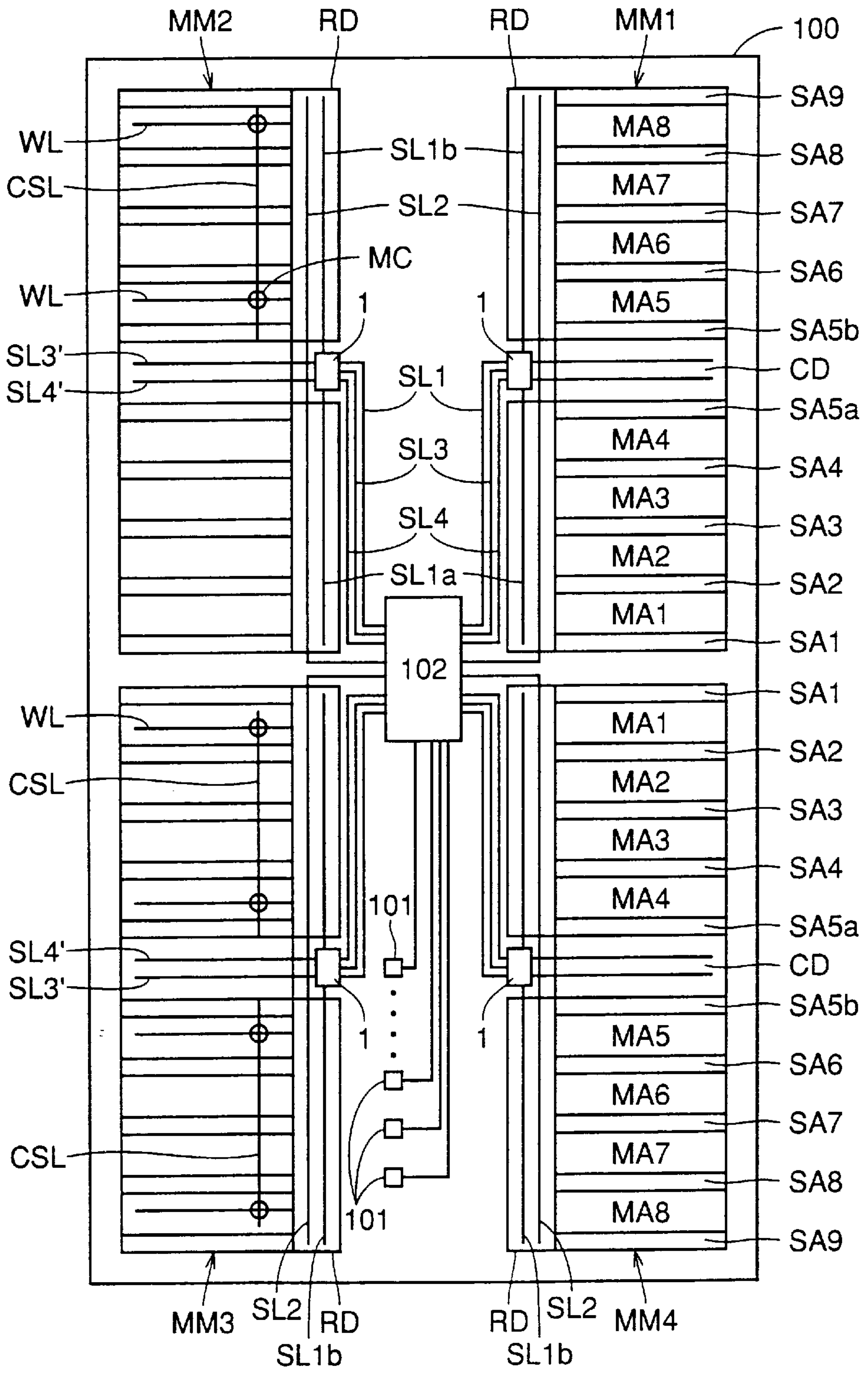
FIG. 1 illustrates the layout of a DRAM according to an embodiment 1 of the present invention.
Figure 16:
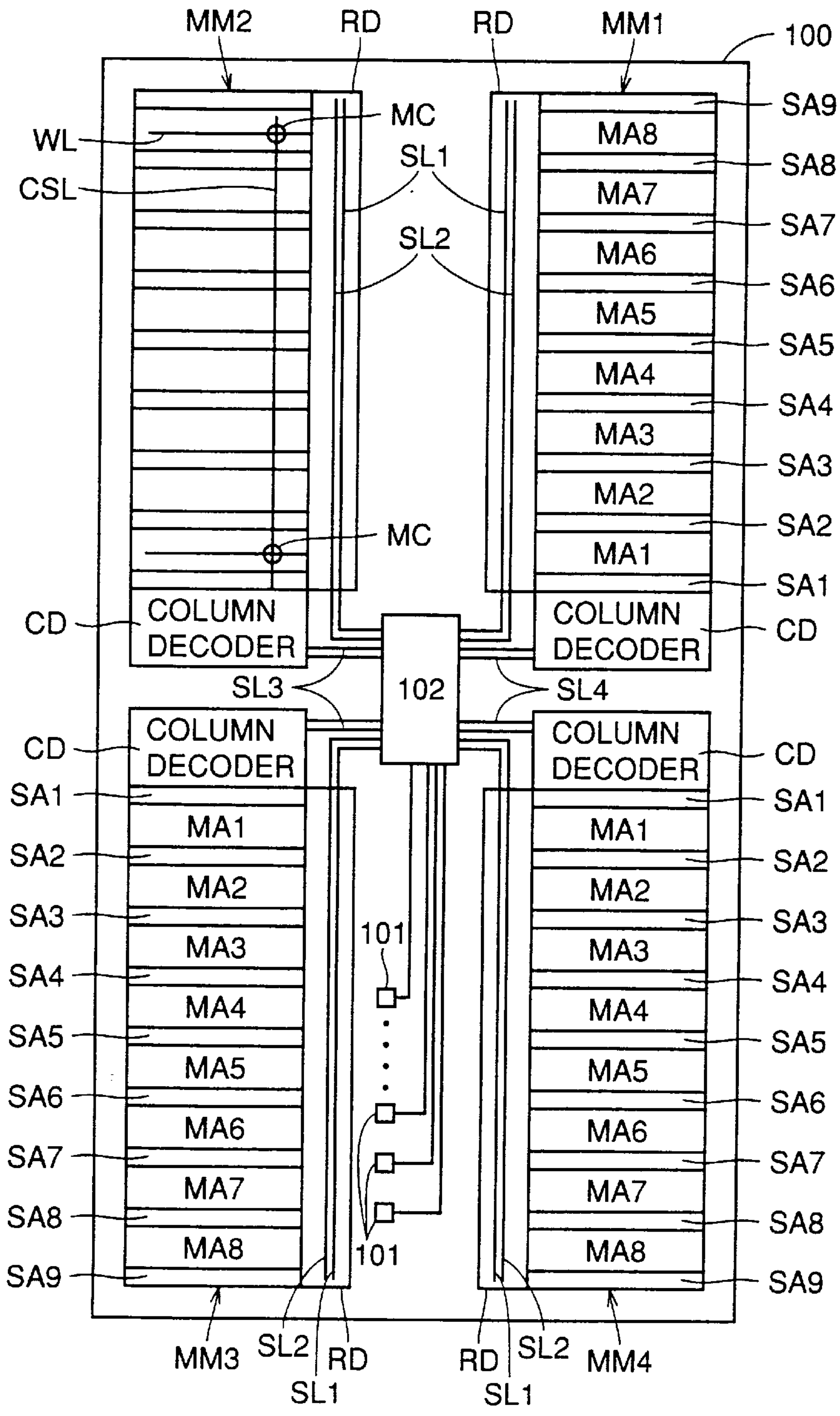
FIG. 16 illustrates the layout of a conventional DRAM.
Figure 17:
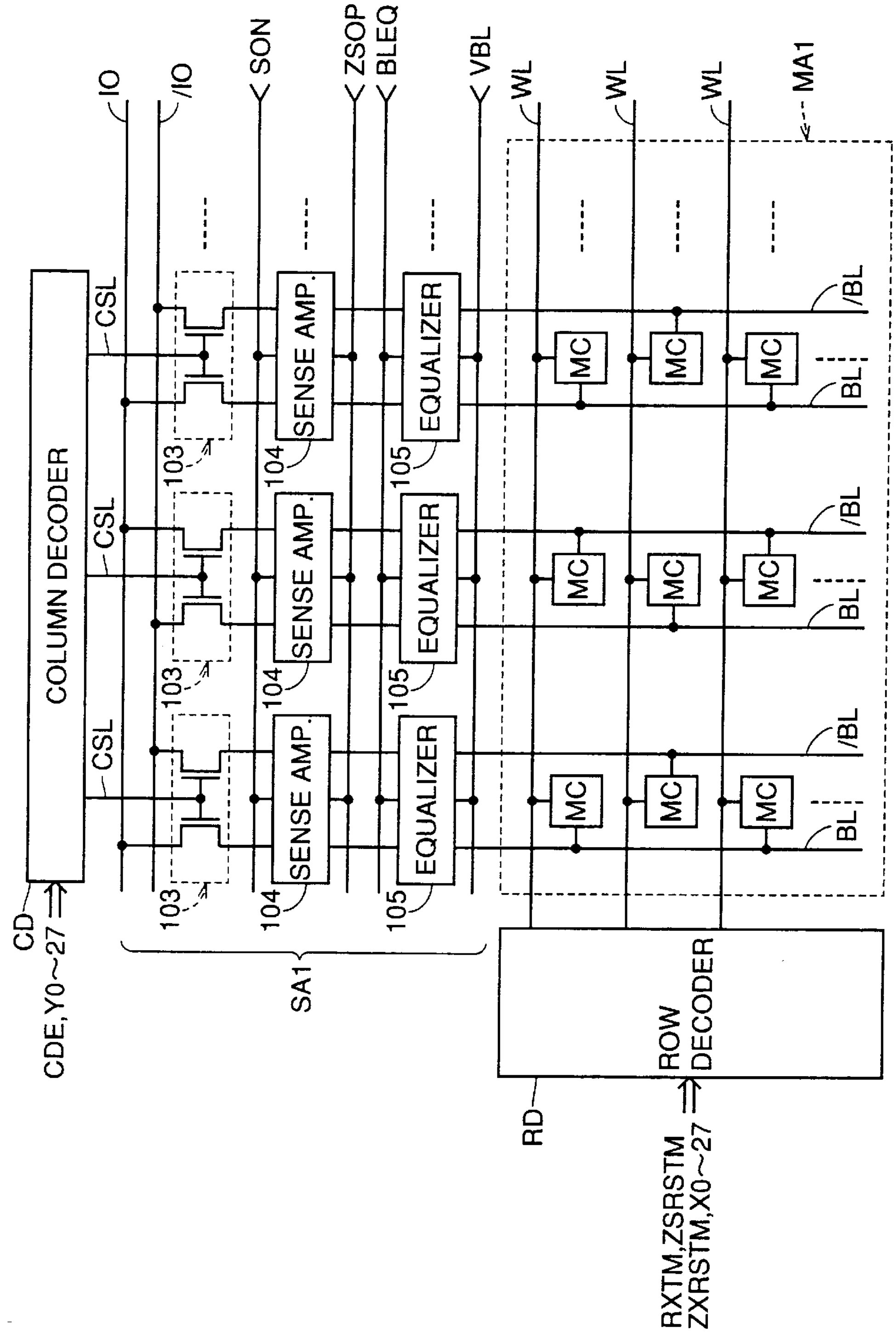
FIG. 17 is a circuit block diagram showing the structures of a sense amplifier zone and a memory array of the DRAM shown in FIG. 16.
Figure 18:
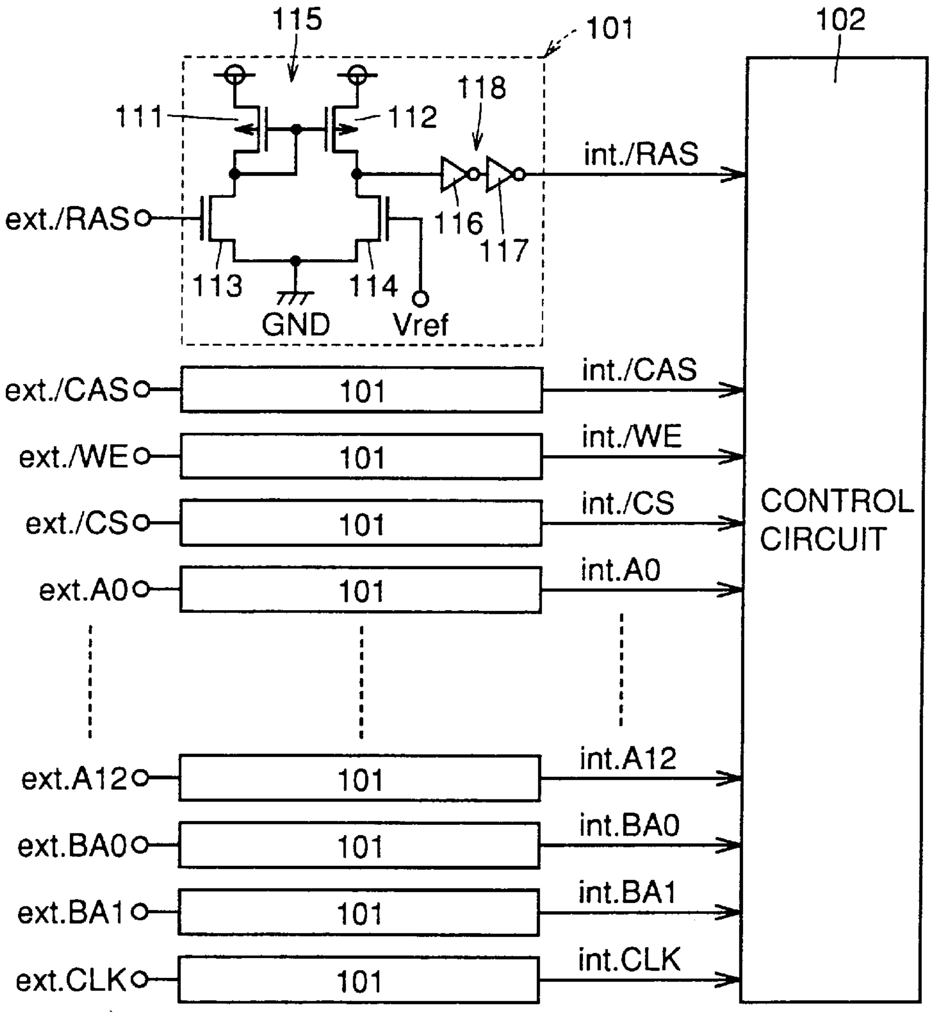
FIG. 18 is a circuit diagram showing the structures of input buffers of the DRAM shown in FIG. 16; 1

FIG. 1 illustrates the layout of a DRAM according to &n embodiment 1 of the present invention in contrast with FIG. 16.

Referring to FIG. 1, this DRAM is different from that shown in FIG. 16 in a point that a column decoder CD is provided between memory arrays MA4 and MA5 and a repeater 1 is newly provided in the vicinity of the column decoder CD in each memory mat MM. Further, sense amplifier zones SA5*a* and SA5*b* dedicated to the memory arrays MA4 and MA5 respectively are provided in place of the sense amplifier zone SA shared by the memory arrays MA4 and MA5 in the DRAM shown in FIG. 16.

A signal line SL2 extends from a control circuit 102 over each row decoder RD, similarly to the prior art. Signal lines SL1, SL3 and SL4 are connected between the control circuit 102 and each repeater 1. Each signal line SL1 is branched into two signal lines SL1*a* and SL1*b* through the repeater 1. The signal line SL1*a* extends along a lower portion of the row decoder RD (portion corresponding to memory arrays MA1 to MA4). The signal line SL1*b* extends along an upper portion of the row decoder RD (portion corresponding to memory arrays MA5 to MA8). The signal lines SL3 and SL4 are connected to signal lines SL3' and SL4' extending over the column decoder CD through the repeater 1.

Figure 2:
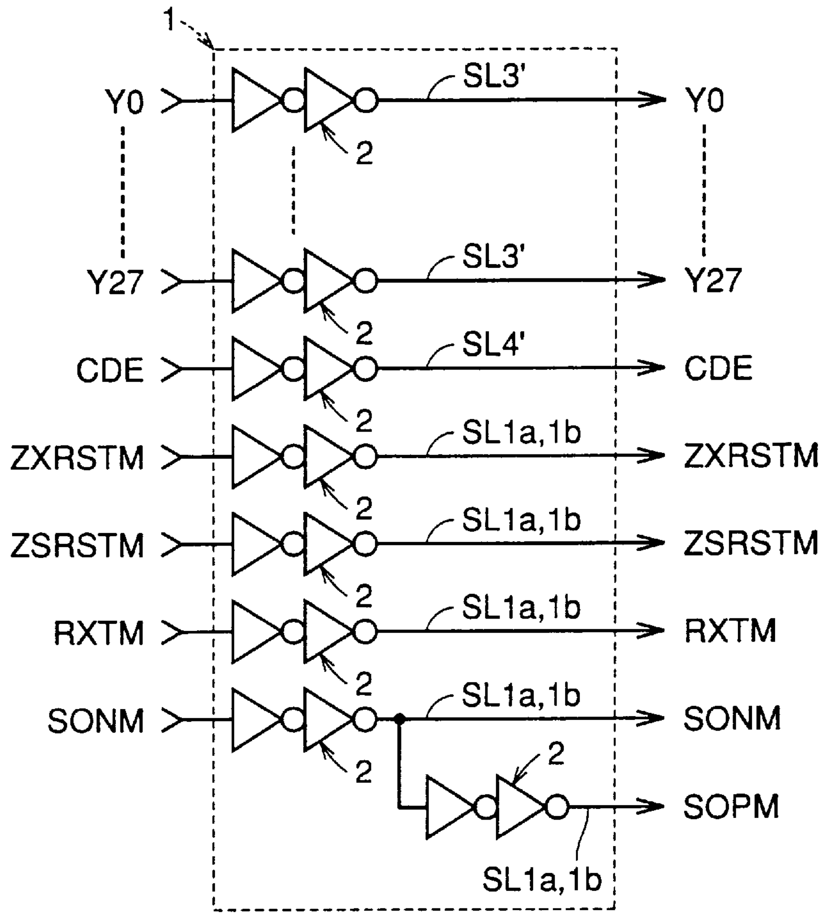
FIG. 2 is a circuit diagram showing the structure of a repeater shown in FIG. 1.

As shown in FIG. 2, each repeater 1 includes a plurality of buffers 2 provided in correspondence to predecode signals Y0 to Y27, a column decoder activation signal CDE, a row decoder reset signal ZXRSTM, a sense amplifier inactivation signal ZSRSTM, a row decoder activation signal RXTM and sense amplifier activation signals SONM and SOPM respectively.

Each of the predecoder signals Y0 to Y27 is supplied to the column decoder CD through the buffer 2 and the signal line SL3'. The column decoder activation signal CDE is supplied to the overall column decoder CD through the buffer 2 and the signal line SL4'. Each of the signals ZXRSTM, ZSRSTM, RXTM and SONM is supplied to the overall row decoder RD through the buffer 2 and the signal lines SL1*a* and SL1*b*. The signal SONM outputted from the buffer 2 is delayed by another buffer 2 to form the signal SOPM, which is supplied to the overall row decoder RD through the signal lines SL1*a* and SL1*b*.

Figure 3:
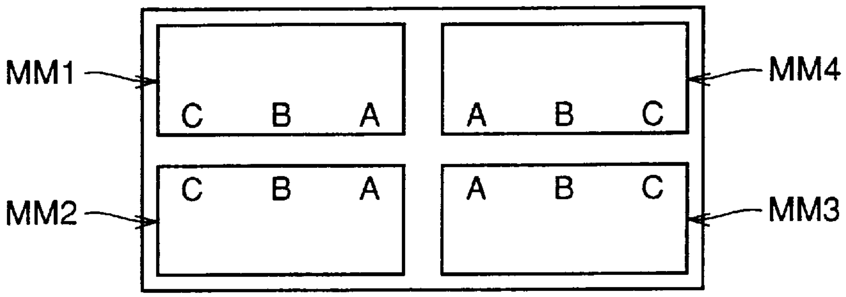
FIG. 3 is adapted to illustrate effects of the DRAM shown in FIG. 1.
Figures 4A, 4B, 4C:
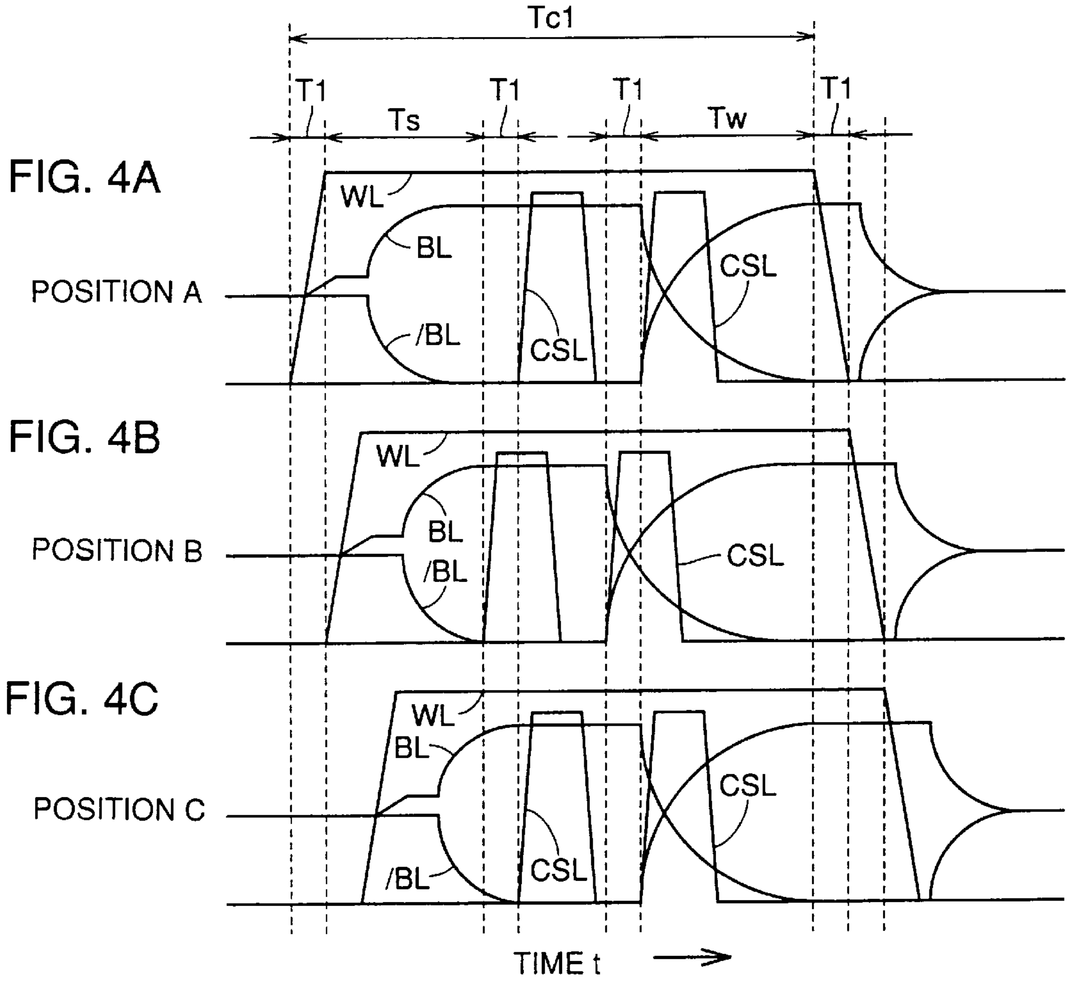
FIGS. 4A to 4C are adapted to illustrate effects of the DRAM shown in FIG. 1.

Advantages of the aforementioned structure are now described. If a DRAM chip is increased in size, column selection lines CSL are lengthened to increase a delay time. Therefore, it is assumed that the column decoders CD are arranged on positions B (central portions of the memory mats MM) in FIG. 3 for halving the lengths of the column selection lines CSL. In this structure, each column selection line CSL quickly selects a pair of bit lines BL and /BL on each position B as shown in FIGS. 4A to 4C. On the other hand, selection of word lines WL and activation of sense amplifiers 104 are performed by a predecode signal and a sense amplifier activation signal generated at the central portion of the chip, whereby the positions A, B and C are selected in this order. The column selection line CSL must be activated after the voltage between the bit lines BL and /BL is sufficiently amplified. When the activation timing for the column selection line CSL is adjusted on the position B, therefore, a waste time corresponding to a delay time T1 between the positions A and B results on the position A.

The word line WL must fall after a memory cell MC sufficiently restores write data. A write operation is performed after the column selection line CSL is selected, and hence writing at the positions A and C is most retarded. If the word line WL falls after data writing on the position A, therefore a waste time corresponding to twice the delay time T1 between the positions A and B results on the position B. Thus, a time Tc1 necessary for reading and writing increases by 2×T1 as compared with the sum Ts+Tw of a sense amplifier amplification period Ts and a write time Tw, to inhibit a high-speed operation.

In this embodiment, therefore, the row decoder activation signal RXTM, the row decoder reset signal ZXRSTM, the sense amplifier activation signal SONM and the sense amplifier inactivation signal ZSRSTM are guided to the buffers 2 of the repeater 1 arranged on the position B and thereafter the signals ZXRSTM, ZSRSTM, RXTM, SONM and SOPM are transmitted in the directions A and C, thereby controlling the row decoder RD and the sense amplifier 104. In this structure, both of the word line WL and the column selection line CSL are first selected on the position B and finally selected on the positions A and C.

Figures 5A, 5B, 5C:
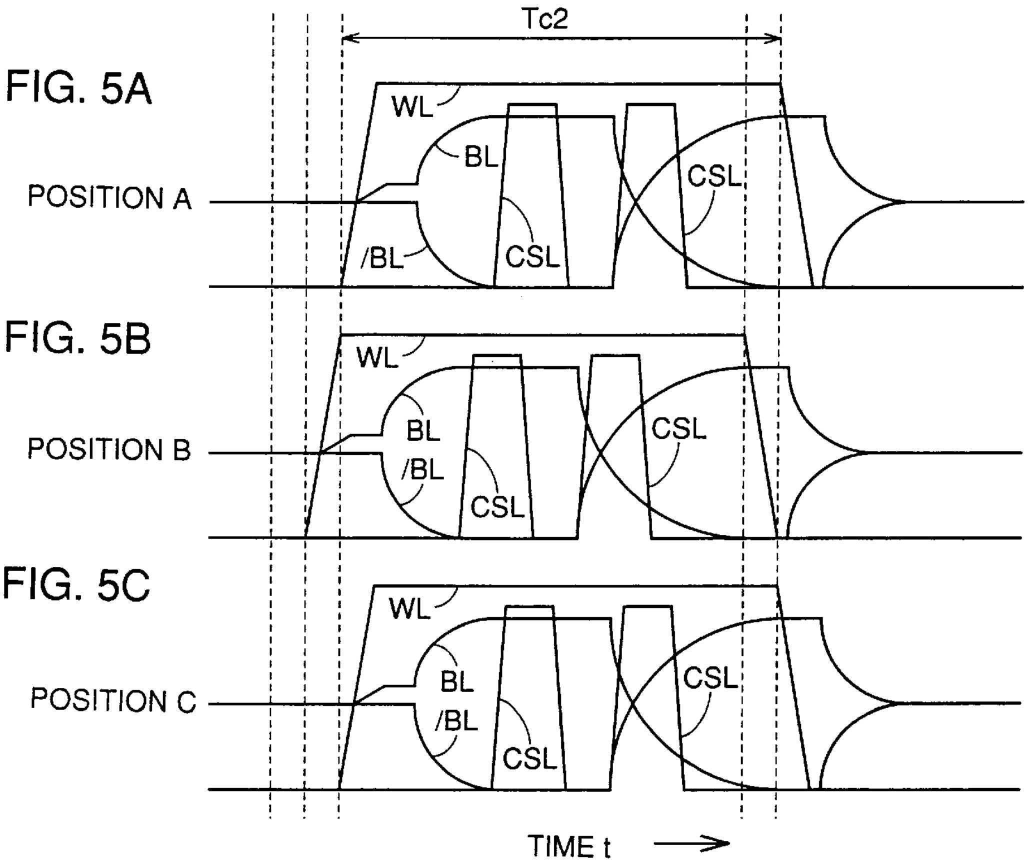
FIGS. 5A to 5C are adapted to illustrate effects of the DRAM shown in FIG. 1.

When the column selection line CSL is selected on the position B after a lapse of the sense amplifier amplification time Ts, therefore, the column selection lines CSL are selected on the positions A and C also at the sense amplifier amplification end timing to cause no waste time, as shown in FIGS. 5A to 5C. When the word line WL is set to a non-selected level on the position B after a lapse of the write time Tw, the word lines WL enter non-selection levels on the positions A and C at the write end timing, to cause no waste time.

[Embodiment 2]

Figure 19:
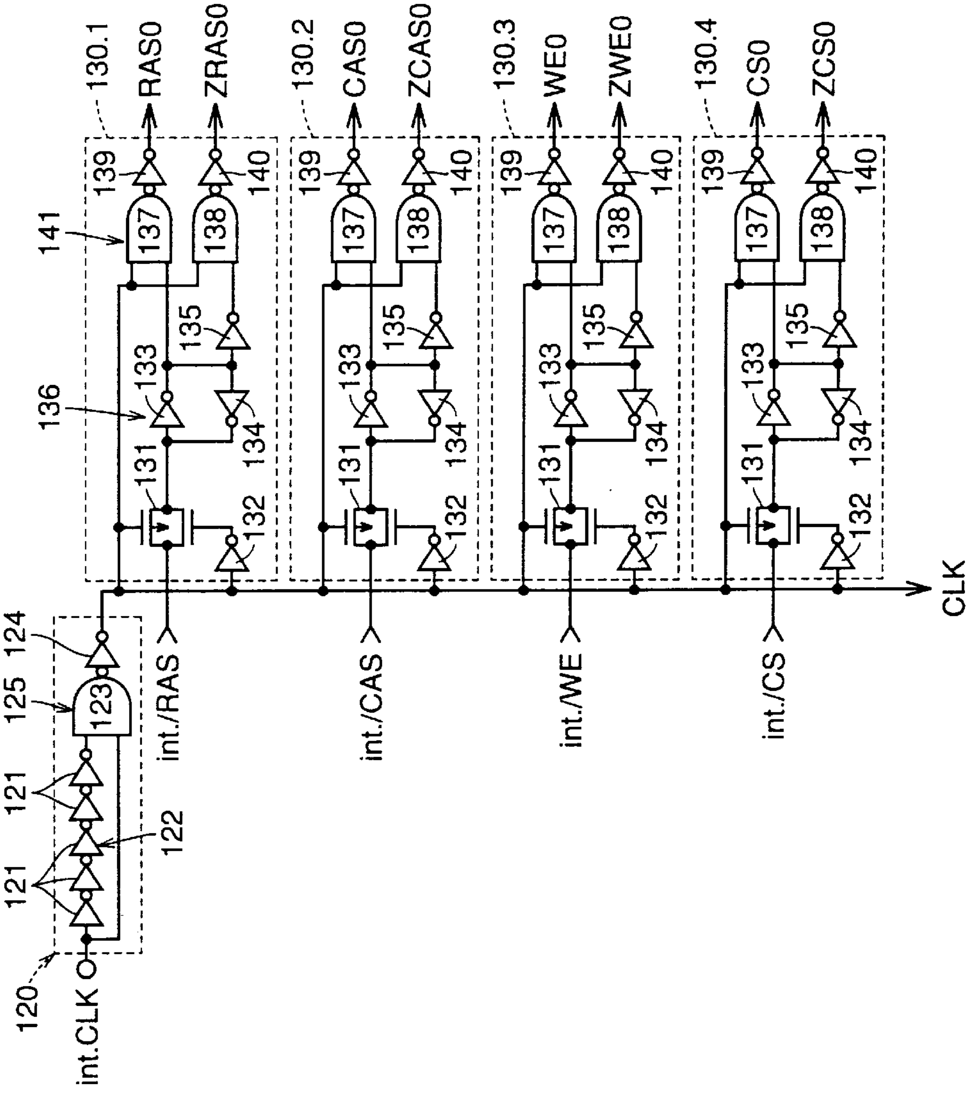
FIG. 19 is a circuit diagram showing the structure of a control circuit shown in FIG. 18.
Figure 22:
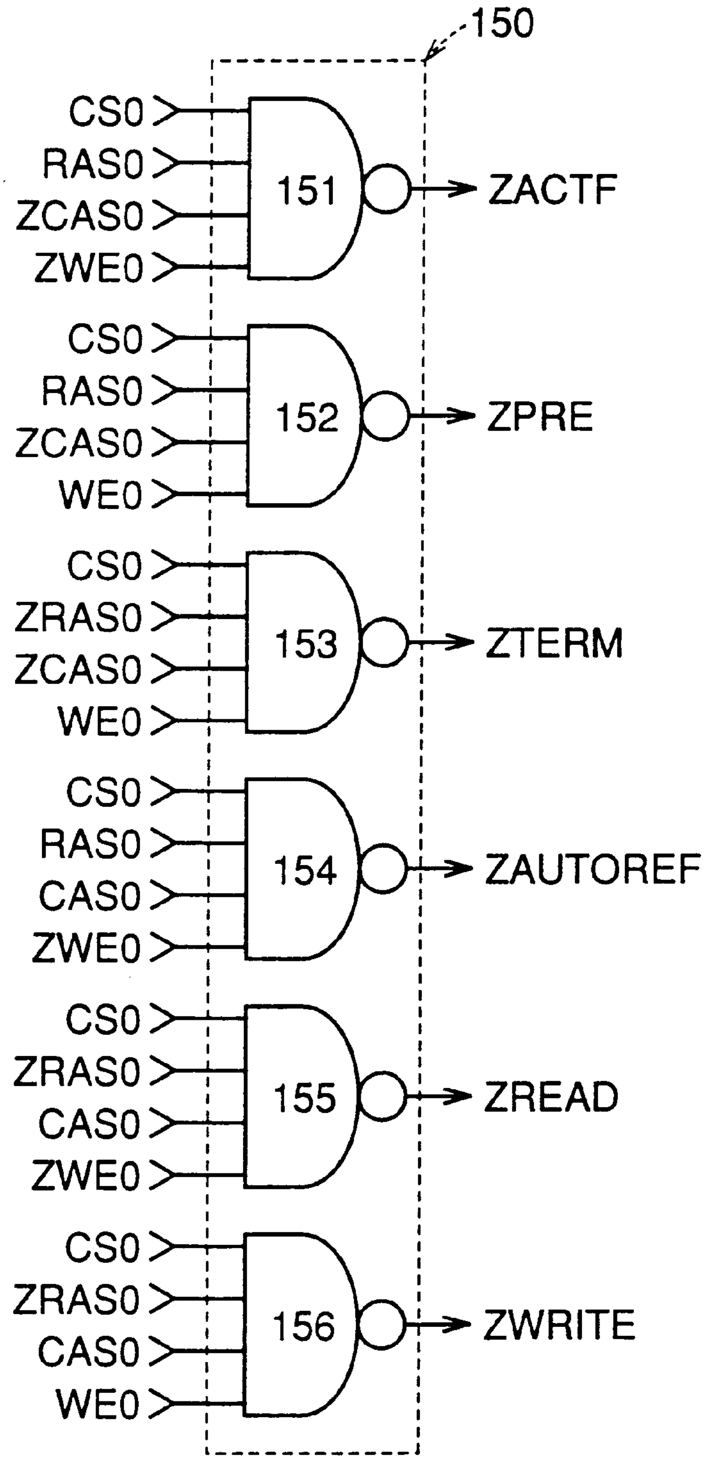
FIG. 22 is a circuit diagram showing the structure of an instruction decoder of the DRAM shown in FIG. 16.

In the conventional DRAM, the signal generation circuits 130.1 to 130.4 shown in FIG. 19 generate the signals RAS0 to ZCS0 so that the instruction decoder 150 shown in FIG. 22 decodes these signals for generating the instruction signals ZACTF to ZWRITE. The instruction decoder 150 is formed by the four-input NAND gates 151 to 156 each including four N-channel MOS transistors serially connected between the output node thereof and the line of the ground potential GND. When the power supply voltage Vcc lowers, therefore, the delay time disadvantageously increases. An embodiment 2 of the present invention is adapted to solve this problem.

Figure 6:
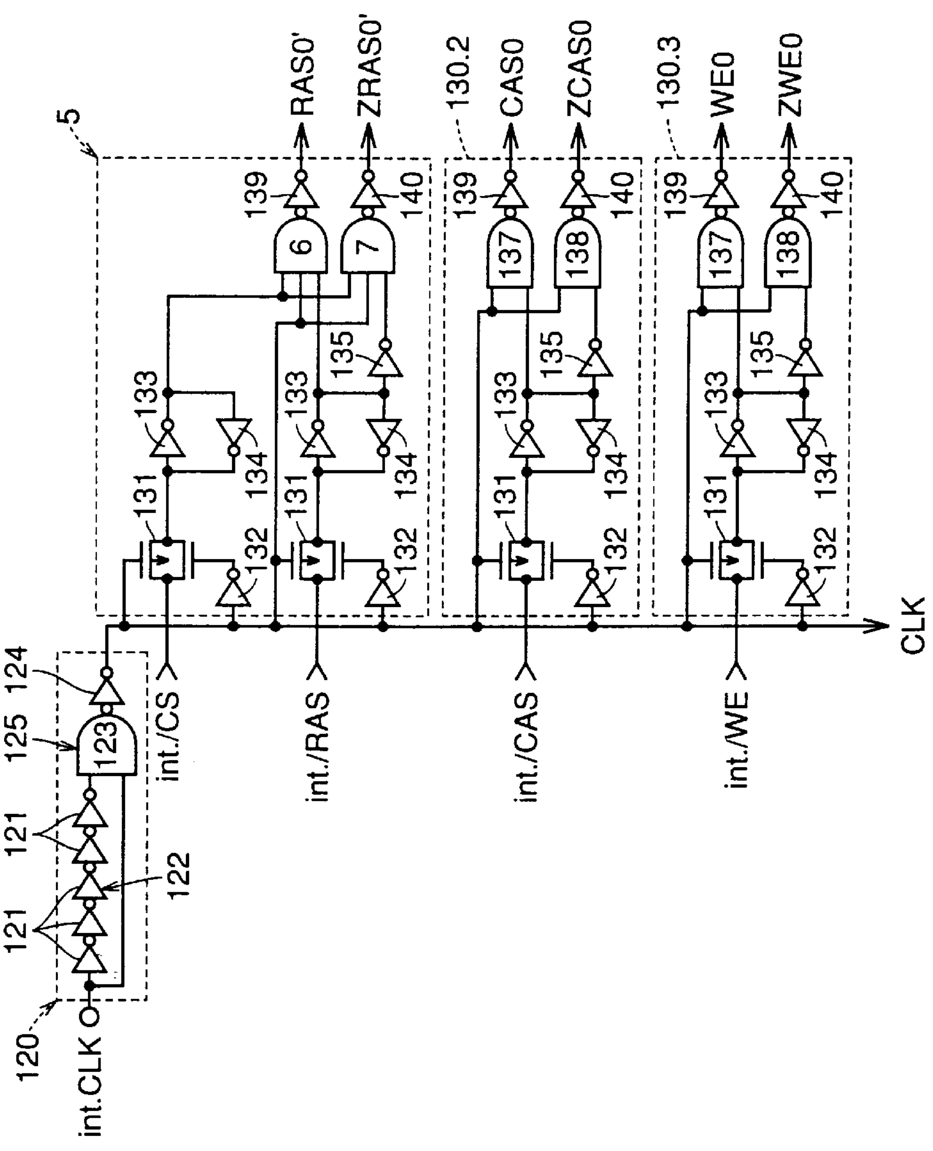
FIG. 6 is a circuit diagram showing the structure of a control circuit of a DRAM according to an embodiment 2 of the present invention.

FIG. 6 is a circuit diagram showing the structure of a control circuit for a DRAM according to the embodiment 2 of the present invention in contrast with FIG. 19. Referring to FIG. 6, the control circuit according to this embodiment is different from that shown in FIG. 19 in a point that a signal generation circuit 5 substitutes for the signal generation circuits 130.1 and 130.4.

In the signal generation circuit 5 formed by combining the signal generation circuits 130.1 and 130.4 with each other, three-input NAND gates 6 and 7 substitute for the two-input NAND gates 137 and 138 of the signal generation circuit 130.1, the invertors 135, 139 and 140 and the NAND gates 137 and 138 of the signal generation circuit 130.4 are removed, and an output of an invertor 133 is inputted in the NAND gates 6 and 7.

A signal RAS0' outputted from an invertor 139 responsively goes high for activation when signals int./CS and int./RAS go low together. A signal ZRAS0' outputted from an invertor 140 responsively goes high for activation when the signals int./CAS and int./RAS go low and high respectively.

Figure 7:
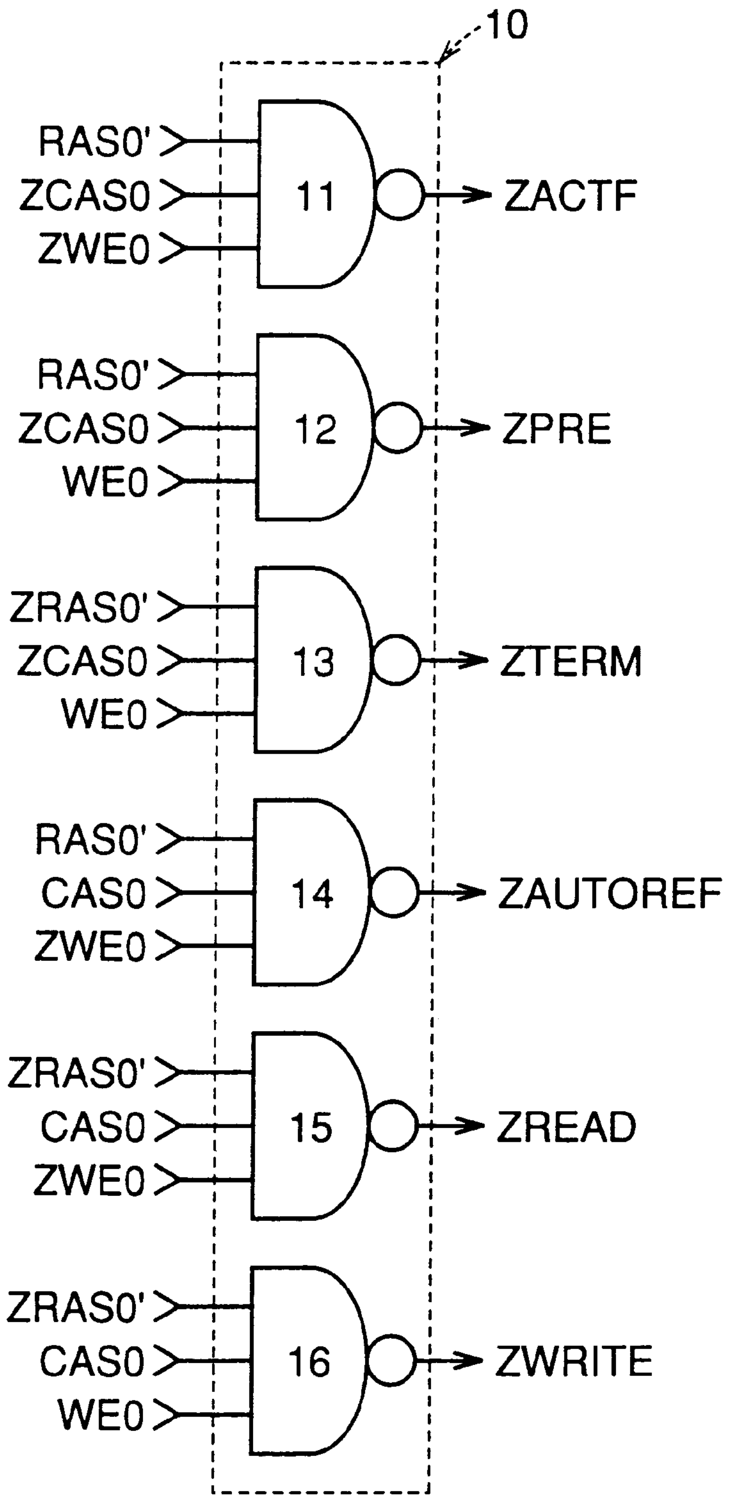
FIG. 7 is a circuit diagram showing the structure of an instruction decoder of the DRAM shown in FIG. 6.

FIG. 7 is a circuit diagram showing the structure of an instruction decoder 10 of this DRAM in contrast with FIG. 22. Referring to FIG. 7, the instruction decoder 10 is different from the instruction decoder 150 shown in FIG. 22 in a point that the signal RAS0' substitutes for the signals CS0 and RAS0, the signal ZRAS0' substitutes for the signals CAS0 and ZRAS0, and three-input NAND gates 11 to 16 substitute for the four-input NAND gates 151 to 156 respectively.

The instruction decoder 10 is formed by the three-input NAND gates 11 to 16, each including three N-channel MOS transistors serially connected between an output node and a line of a ground potential GND. As compared with the conventional DRAM having the instruction decoder 150 formed by the four-input NAND gates 151 to 156 each including four N-channel MOS transistors serially connected between the output node and the line of the ground potential GND, increase of a delay time following reduction of the power supply voltage Vcc is further suppressed.

[Embodiment 3]

Figure 20:
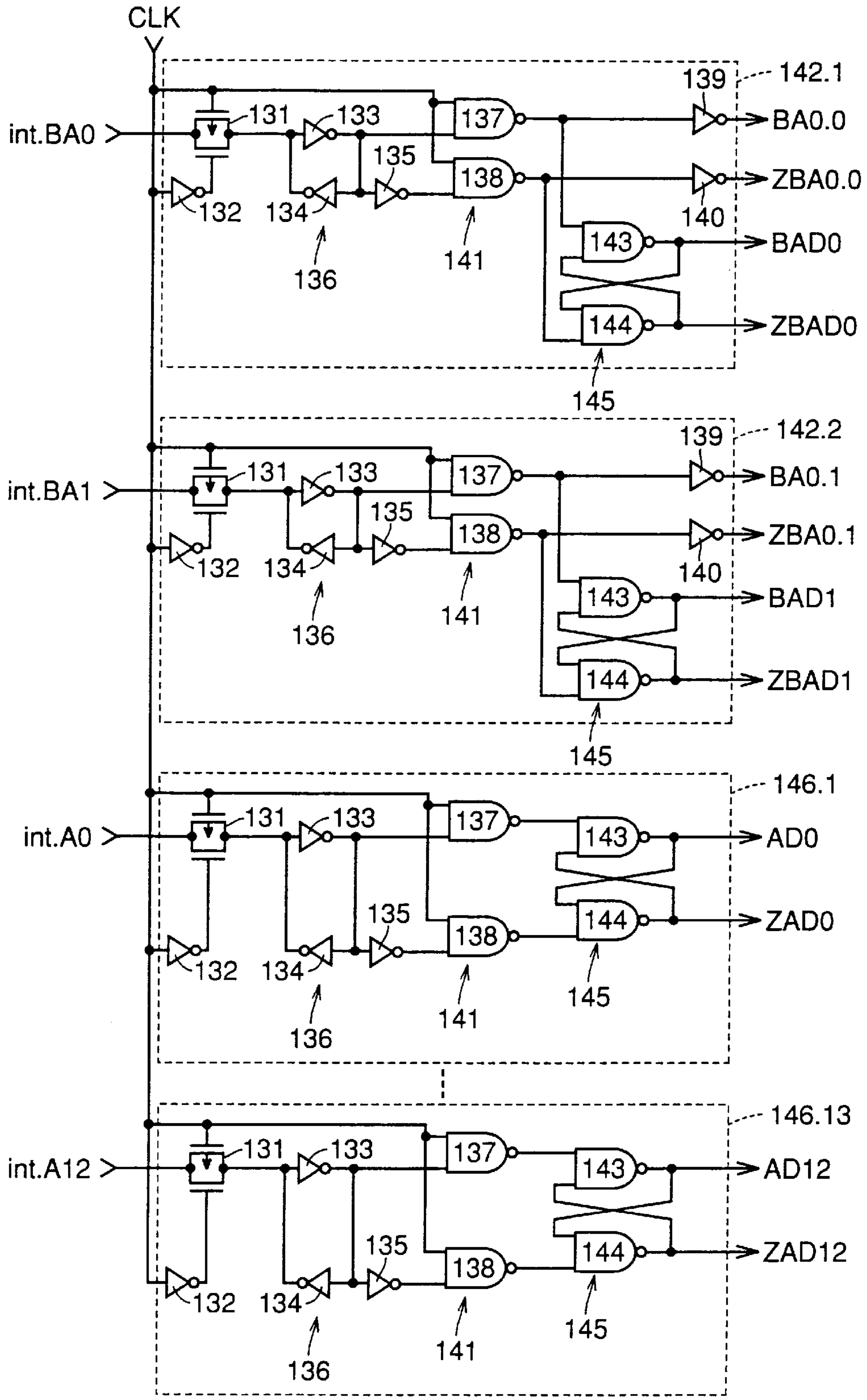
FIG. 20 is another circuit diagram showing the structure of the control circuit shown in FIG. 18.
Figures 21A, 21B, 21C, 21D, 21E, 21F, 21G:
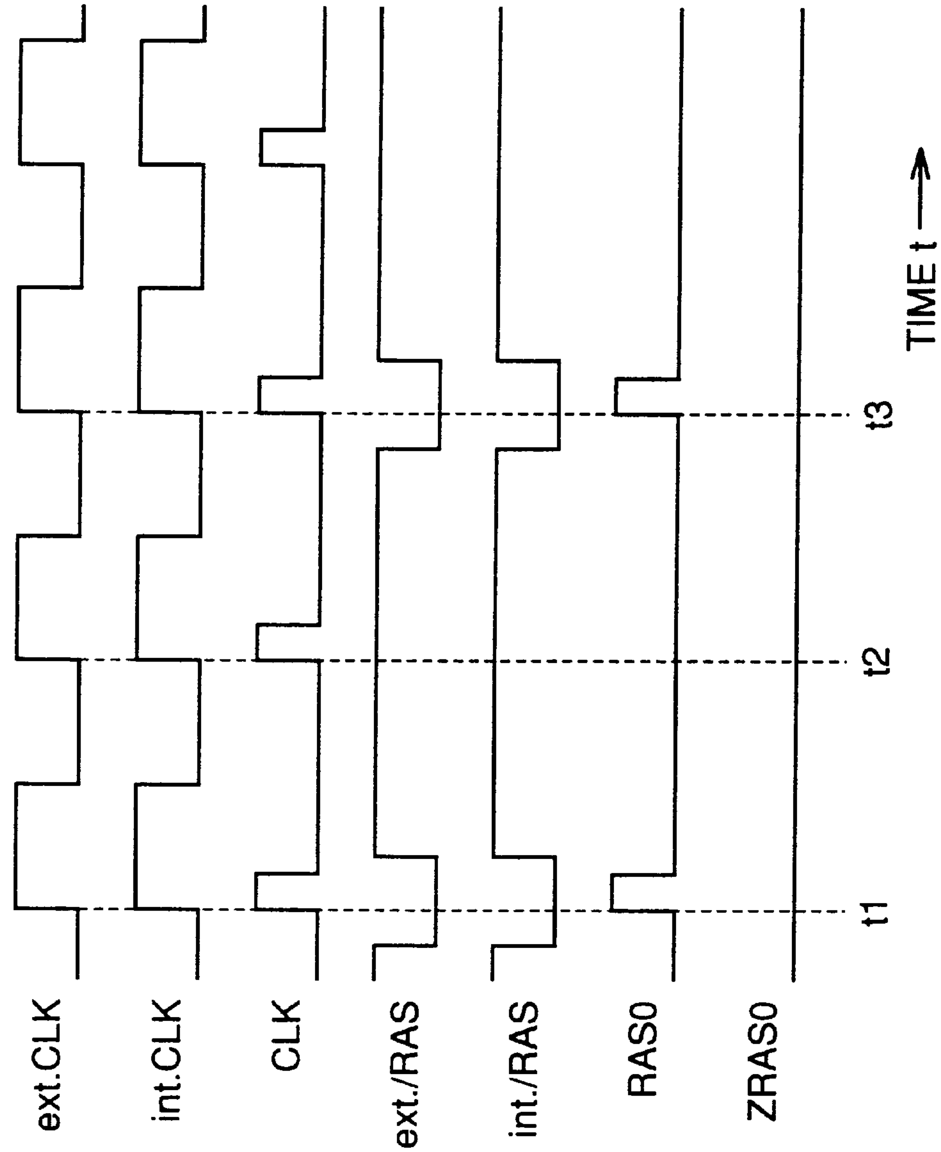
FIGS. 21A to 21G are timing charts showing operations of the control circuit shown in FIGS. 19 and 20.
Figure 27:
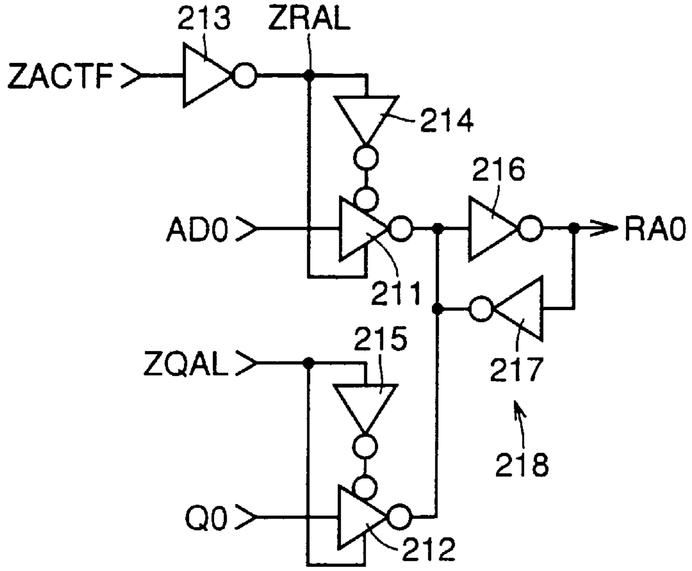
FIG. 27 is a circuit diagram showing the structure of a signal generation circuit for generating a signal RA etc. in the DRAM shown in FIG. 16.

In the conventional DRAM, each of the signal generation circuits 146.1 to 146.13 shown in FIG. 20 generates the address signal AD from the clock signal CLK through the two gates 137 and 143. However, the circuit shown in FIG. 27 employs the inversion signal of the row activation signal ZACTF as the signal ZRAL for incorporating the address signal AD. Thus, the circuit controls the signal AD generated through the two gates 137 and 143 as viewed from the clock signal CLK with the signal ZRAL generated through four gates as viewed from the clock signal CLK, leading to a wasteful standby time. An embodiment 3 of the present invention is adapted to solve this problem.

Figure 8:
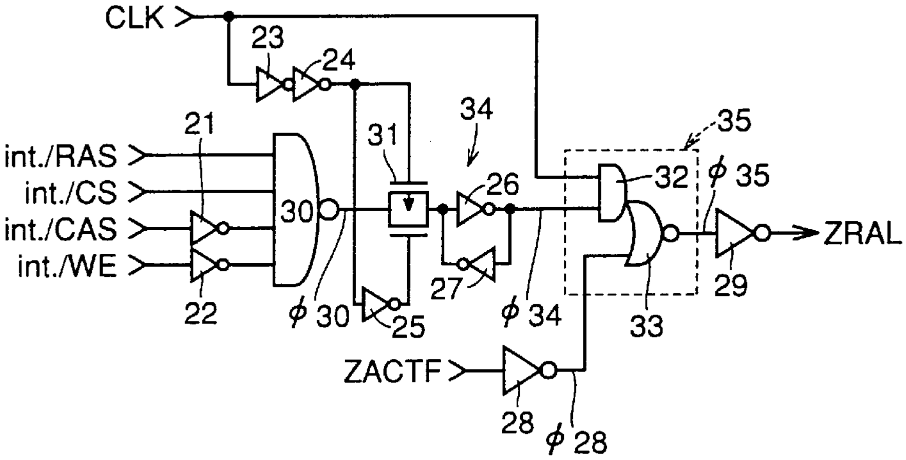
FIG. 8 is a circuit diagram showing the structure of a ZRAL signal generation circuit of a DRAM according to an embodiment 3 of the present invention.

FIG. 8 is a circuit diagram showing the structure of a signal generation circuit of a DRAM according to the embodiment 3 of the present invention.

Referring to FIG. 8, this signal generation circuit includes invertors 21 to 29, a NAND gate 30, a transfer gate 31, an AND gate 32 and a NOR gate 33. The NAND gate 30 outputs a low-level signal φ30 when signals int./RAS, int./CS, int./CAS and int./WE go high, high, low and low respectively. This signal φ30 is inputted in a latch circuit 34 formed by the invertors 26 and 27 through the transfer gate 31 while a clock signal CLK is at a low level. An output signal φ34 from the latch circuit 34 passes through the AND gate 32 and is inputted in a first input node of the NOR gate 33 while the clock signal CLK is at a high level. On the other hand, a row activation instruction signal ZACTF is inputted in a second input node of the NOR gate 33 through the invertor 28. An output signal φ35 of the NOR gate 33 is inverted by the invertor 29, to form a signal ZRAL.

Figure 9:
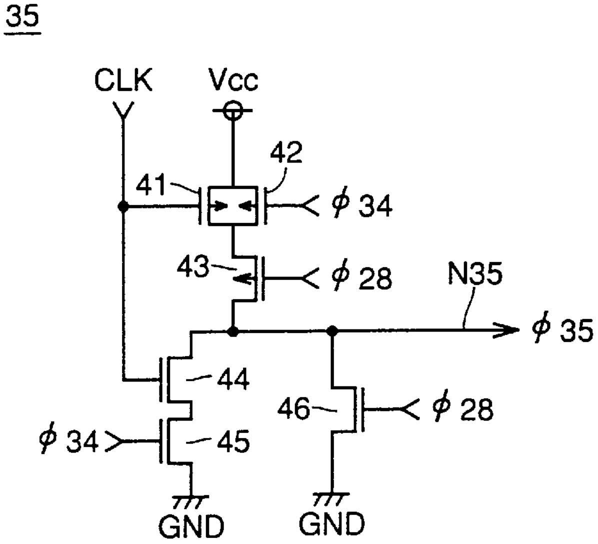
FIG. 9 is a circuit diagram showing the structure of a gate circuit shown in FIG. 8.
Figures 10A, 10B, 10C, 10D, 10E, 10F, 10G, 10H, 10I, 10J:
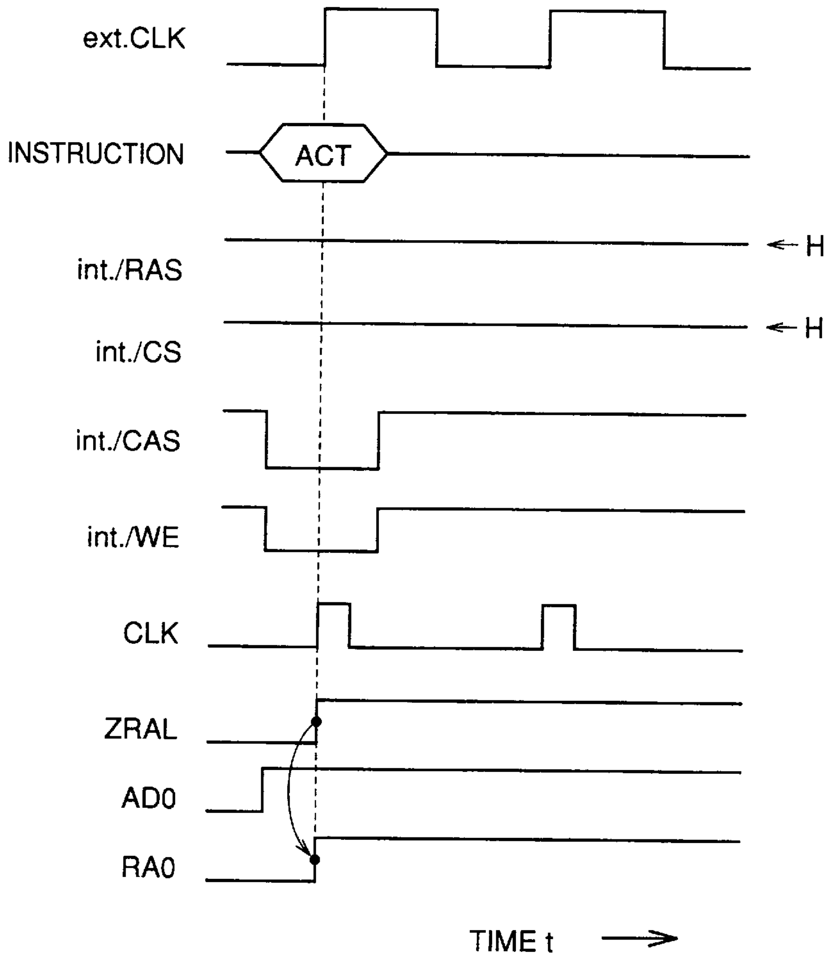
FIGS. 10A to 10J are timing charts showing operations of the DRAM shown in FIG. 8.

FIG. 9 is a circuit diagram showing the structure of a gate circuit 35 formed by the AND gate 32 and the NOR gate 33.

Referring to FIG. 9, this gate circuit 35 includes P-channel MOS transistors 41 to 43 and N-channel MOS transistors 44 to 46. The P-channel MOS transistors 41 and 43 are serially connected between a line of a power supply potential Vcc and an output node N35. The P-channel MOS transistor 42 is connected in parallel with the P-channel MOS transistor 41. The N-channel MOS transistors 44 and 45 are serially connected between the output node N35 and a line of a ground potential GND. The N-channel MOS transistor 46 is connected between the output node N35 and a line of the ground potential GND. The MOS transistors 41 and 44 receive the clock signal CLK, the MOS transistors 43 and 46 receive a signal φ28, and the MOS transistors 42 and 45 receive the signal φ34. Therefore, the gate circuit 35 is regarded as a single gate.

In the embodiment 3 of the present invention, the signal ZRAL is generated by the two gates 35 and 29 as viewed from the clock signal CLK, thereby causing no wasteful standby time when incorporating a signal AD, dissimilarly to the prior art. Further, the signal ZRAL is formed by an OR signal of the signal φ34 generated on the basis of the signals int./RAS to int./WE and the inversion signal φ28 of the signal ZACTF, whereby the signal ZRAL will not return to a low level even if the signals int./RAS to int./WE immediately change, as shown in FIGS. 10A to 10J.

[Embodiment 4]

Figure 24:
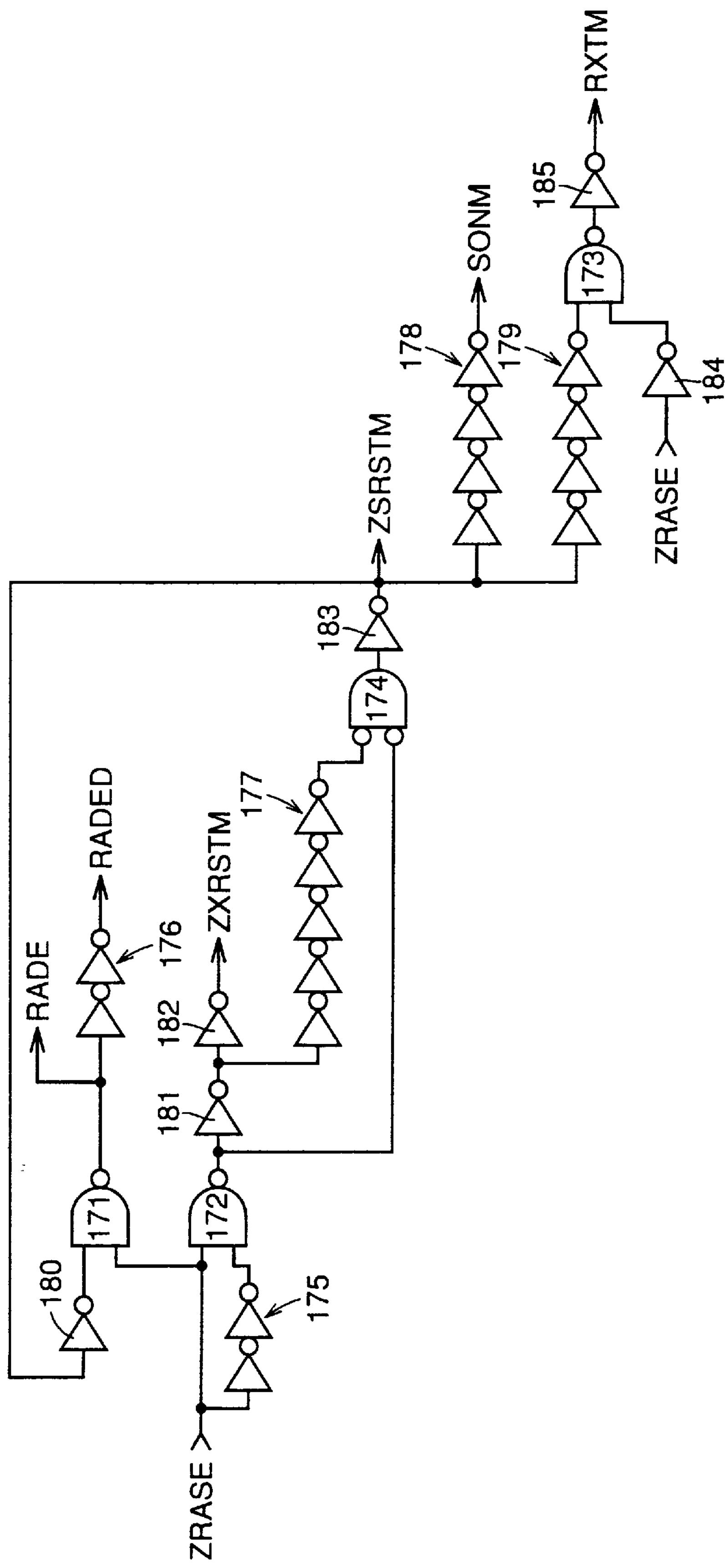
FIG. 24 is a circuit diagram showing the structure of an internal control signal generation circuit of the DRAM shown in FIG. 16.
Figures 25A, 25B, 25C, 25D, 25E, 25F, 25G, 25H, 25I, 25J, 25K, 25L, 25M:
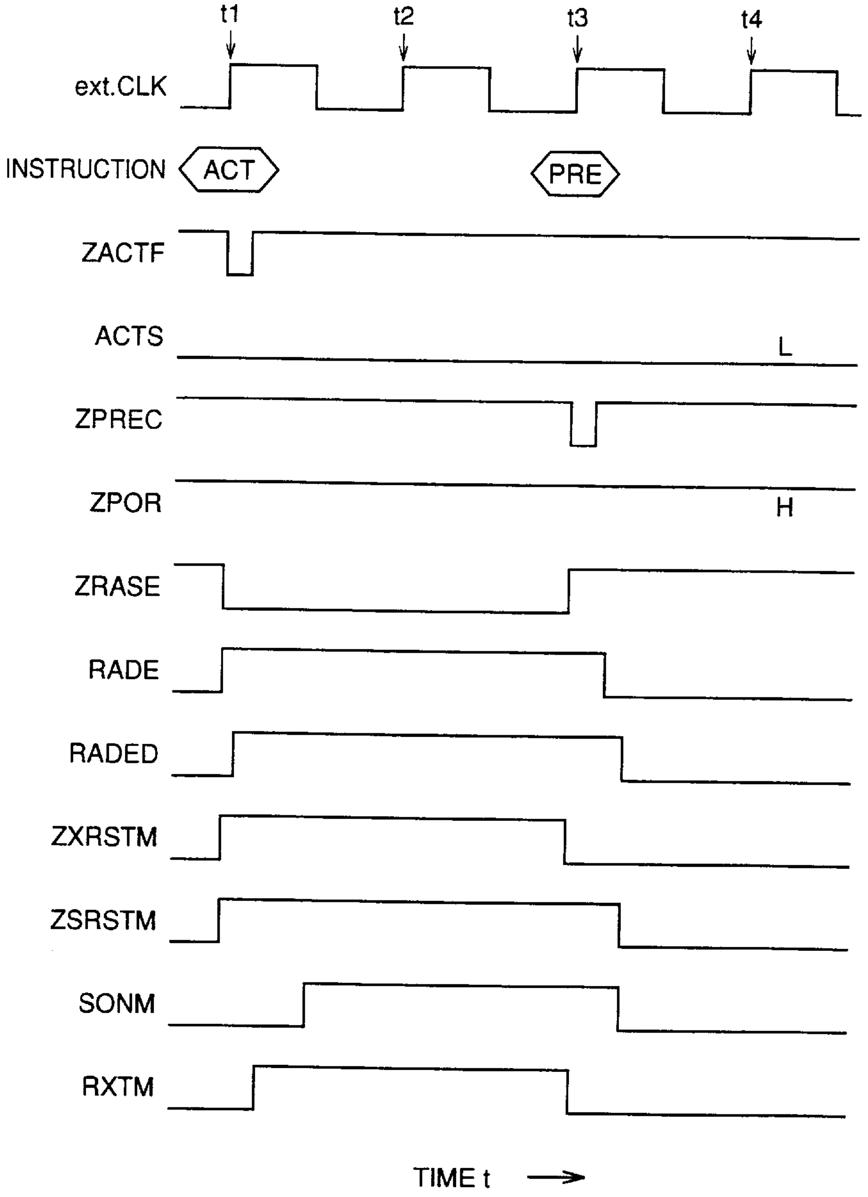
FIGS. 25A to 25M are timing charts showing operations of the circuits shown in FIGS. 23 and 24.
Figure 26:
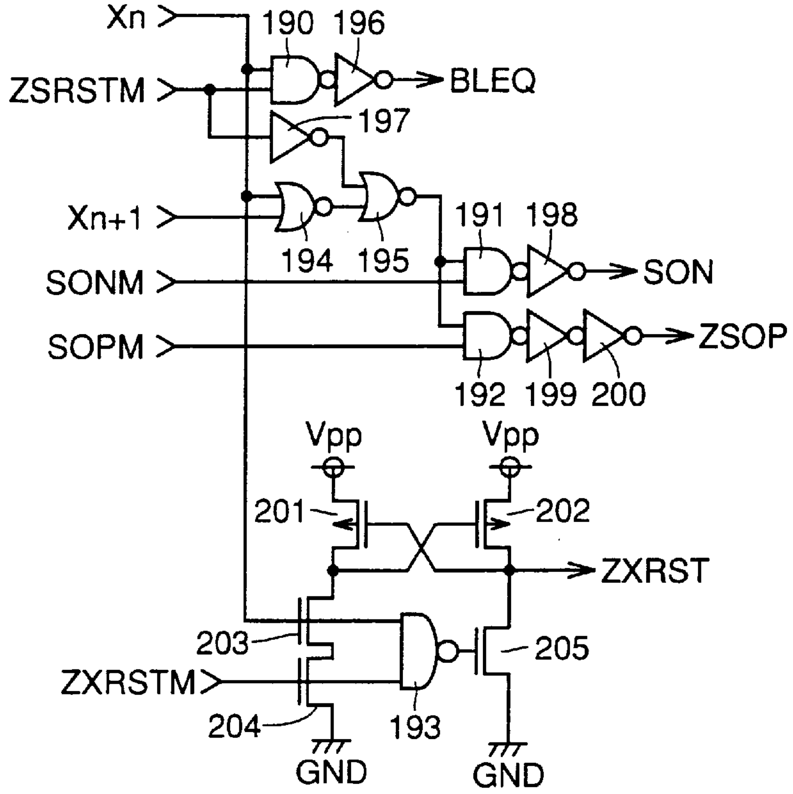
FIG. 26 is a circuit diagram showing the structure of a signal generation circuit for generating a signal BLEQ etc. in the DRAM shown in FIG. 16.

The conventional circuit shown in FIG. 24 generates various control signals when the row activation signal ZRASE goes low. Thus, it is important to set the row activation signal ZRASE low when receiving a row activation instruction, in order to reduce the access time.

When the row activation signal ZRASE is at a low level upon power supply, row-system circuits simultaneously start operations, disadvantageously leading to flow of a large source current. This is a significant problem since a number of DRAMs are provided on a memory board of a computer. An embodiment 4 of the present invention is adapted to solve this problem.

Figure 11:
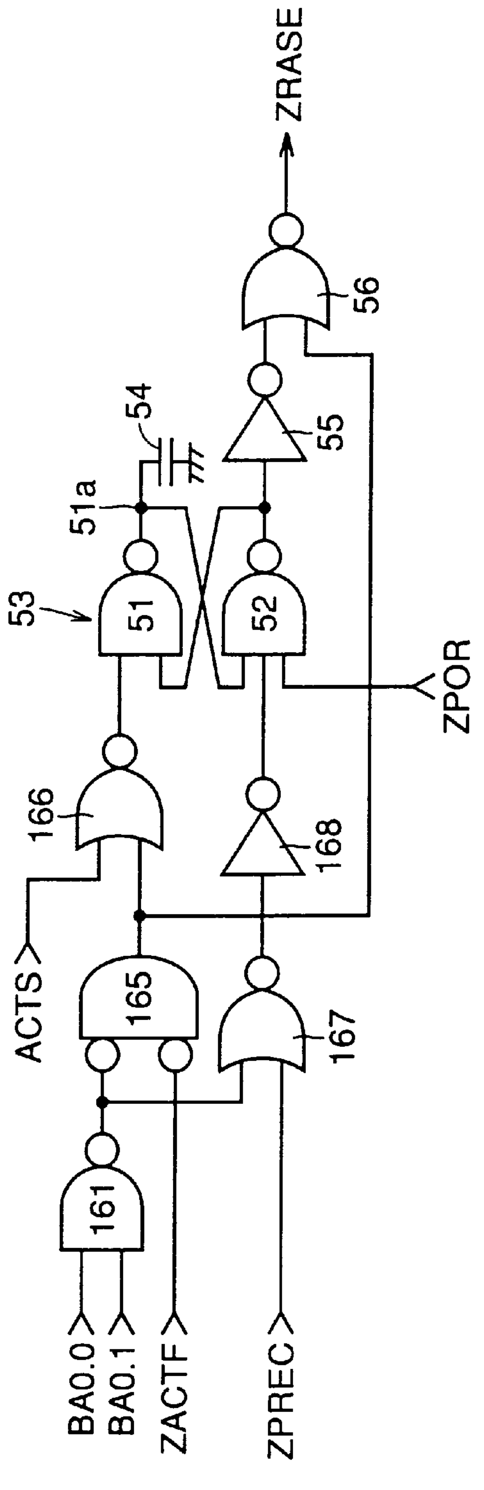
FIG. 11 is a circuit diagram showing the structure of a ZRASE signal generation circuit of a DRAM according to an embodiment 4 of the present invention.
Figure 23:
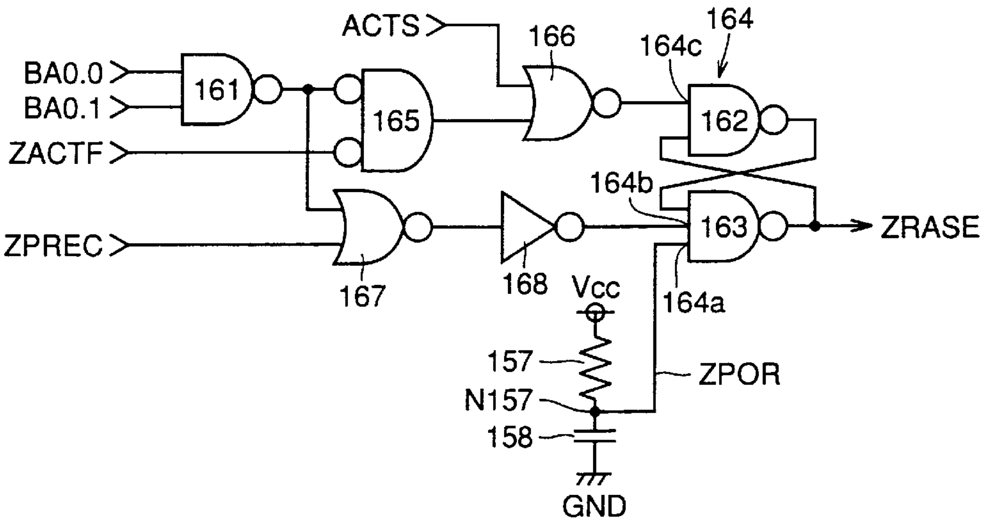
FIG. 23 is a circuit diagram showing the structure of a ZRASE signal generation circuit of the DRAM shown in FIG. 16.

FIG. 11 is a circuit diagram showing the structure of a signal generation circuit of a DRAM according to the embodiment 4 of the present invention in contrast with FIG. 23.

Referring to FIG. 11, this signal generation circuit is different from that shown in FIG. 23 in a point that a flip-flop 53 formed by NAND gates 51 and 52 substitutes for the flip-flop 164 formed by the NAND gates 162 and 163, and a capacitor 54, an invertor 55 and a NOR gate 56 are newly provided.

The capacitor 54 is connected between an output node 51*a* of the NAND gate 51 and a line of a ground potential GND. An output of the NAND gate 52 is inputted in a first input node of the NOR gate 56 through the invertor 55. An output of a NOR gate 165 is inputted in a second input node of the NOR gate 56. An output of the NOR gate 56 forms a signal ZRASE.

While the signal ZRASE is generated through four gates 165, 166, 162 and 163 as viewed from the signal ZACTF in the circuit shown in FIG. 23, the signal ZRASE is generated through the two gates 165 and 56 as viewed from the signal ZACTF in the circuit shown in FIG. 11. Therefore, the time for activating the signal ZRASE in response to the signal ZACTF is reduced to reduce the access time.

Each of the NAND gates 51 and 52 is formed by a plurality of sets of P-channel MOS transistors and N-channel MOS transistors, as is well known. In the NAND gate 51, the channel width of each P-channel MOS transistor is set larger than that of each N-channel MOS transistor, and the threshold voltage of the NAND gate 51 is higher than Vcc/2. In the NAND gate 52, on the other hand, the channel width of each P-channel MOS transistor is set smaller than that of each N-channel MOS transistor, and the threshold voltage of the NAND gate 52 is lower than Vcc/2. Further, the capacitor 54 is connected between the output node 51*a* of the NAND gate 51 and the line of the ground potential GND, whereby outputs of the NAND gates 51 and 52 go low and high respectively upon power supply. Therefore, the signal ZRASE goes high upon power supply, whereby a flow of a large current is prevented in power supply.

[Embodiment 5]

Also in the conventional signal generation circuit shown in FIG. 23, the signal ZPOR is inputted in the reset terminal 164*a* of the flip-flop 164 so that the signal ZRASE goes high for inactivation upon power supply. The conventional signal generation circuit generates the signal ZPOR through an RC filter formed by the resistive element 157 and the capacitor 158 serially connected between the lines of the power supply potential Vcc and the ground potential GND. When the power supply potential Vcc rises faster than the time constant of the RC filter, therefore, the signal ZPOR rises later than the power supply potential Vcc supplied to the signal generation circuit, whereby the signal ZRASE is reset at a low level for inactivation upon power supply. If the power supply potential Vcc rises later than the time constant of the RC filter, however, the signal ZPOR uselessly has the same waveform as the power supply potential Vcc. An embodiment 5 of the present invention is adapted to solve this problem.

Figure 12:
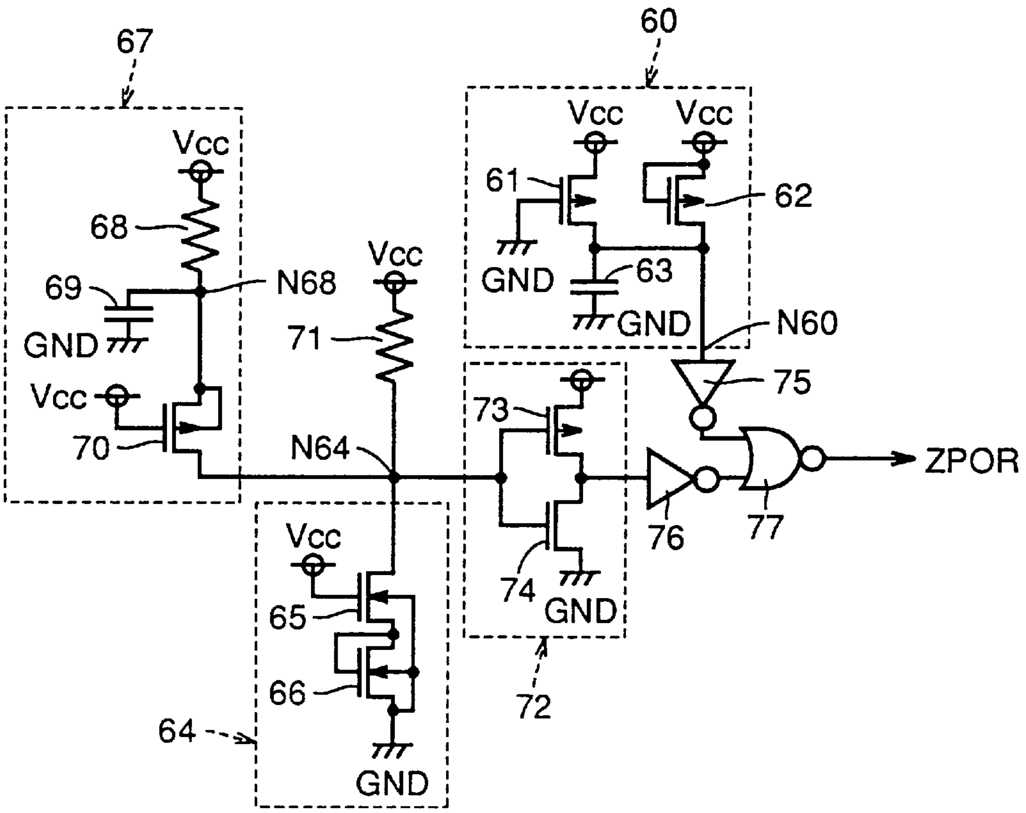
FIG. 12 is a circuit diagram showing the structure of a ZPOR signal generation circuit of a DRAM according to an embodiment 5 of the present invention.

FIG. 12 is a circuit diagram showing the structure of a ZPOR signal generation circuit of a DRAM according to the embodiment 5 of the present invention, and FIGS. 13A to 13E are timing charts showing operations thereof. Referring to FIG. 12, the ZPOR signal generation circuit includes signal generation circuits 60, 64 and 67, a resistive element 71, invertors 72, 75 and 76 and a NOR gate 77.

The signal generation circuit 60 includes P-channel MOS transistors 61 and 62 connected in parallel between lines of a power supply potential Vcc and an output node N60 and a capacitor 63 connected between the output node N60 and a line of a ground potential GND. The P-channel MOS transistors 61 and 62 have gates connected to lines of the ground potential GND and the power supply potential Vcc respectively. The P-channel MOS transistors 61 and 62 form a resistive element and a diode respectively. The signal generation circuit 60 forms an RC filter. An output signal of the signal generation circuit 60 is inverted by the invertor 75 and inputted in a first input node of the NOR gate 77.

The signal generation circuit 64 includes N-channel MOS transistors 65 and 66 serially connected between a node N64 and a line of the ground potential GND. The N-channel MOS transistor 65 has a gate connected to a line of the power supply potential Vcc, while the N-channel MOS transistor 66 has a gate connected to the drain thereof.

The signal generation circuit 67 includes a resistive element 68 and a capacitor 69 serially connected between lines of the power supply potential Vcc and the ground potential GND, and a P-channel MOS transistor 70 connected between a node N68 between the resistive element 68 and the capacitor 69 and a node N64. The P-channel MOS transistor 70 has a gate connected to a line of the power supply potential Vcc.

The resistive element 71 is connected between a line of the power supply potential Vcc and the node N64. The invertor 72 formed by the P-channel MOS transistor 73 and the N-channel MOS transistor 74 and the invertor 76 transmit a signal appearing on the node N64 to a second input node of the NOR gate 77. An output signal of the NOR gate 77 forms a signal ZPOR.

Figures 13A, 13B, 13C, 13D, 13E:
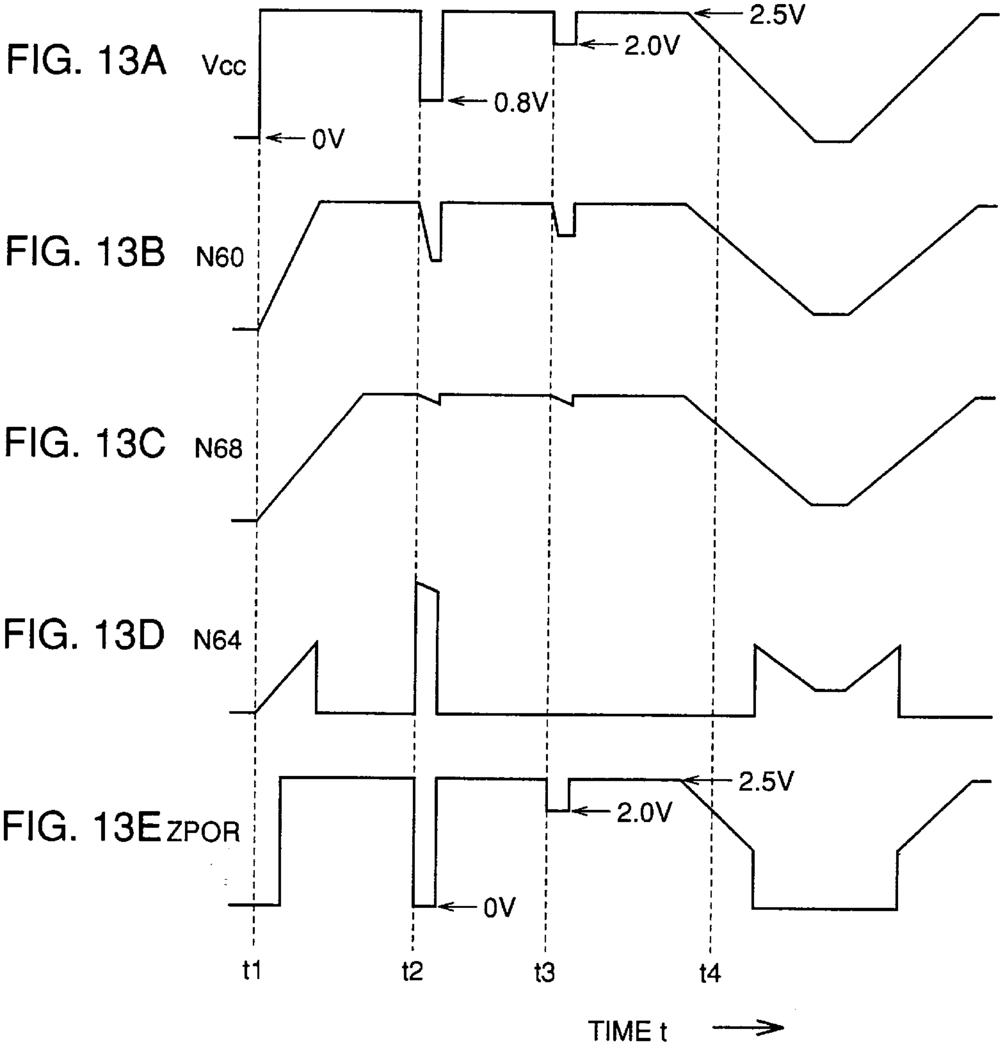
FIGS. 13A to 13E are timing charts showing operations of the ZPOR signal generation circuit shown in FIG. 12.
Figure 14A:
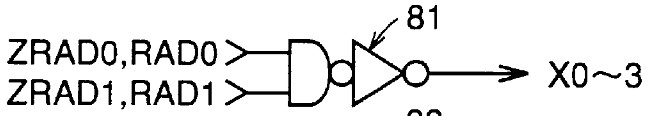
FIGS. 14A to 14F are circuit diagrams showing the structure of a predecoder of a DRAM according to an embodiment 6 of the present invention.
Figure 14B:
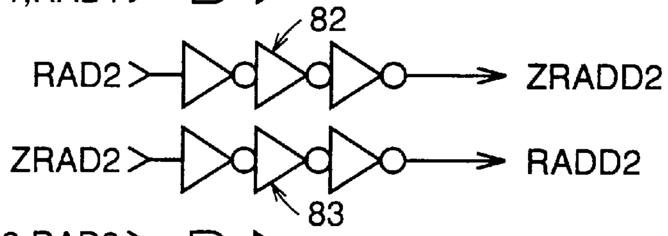
Figure 14C:
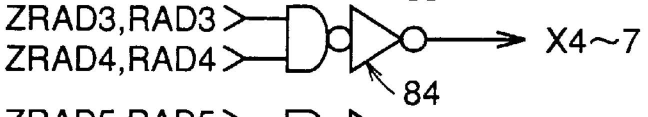
Figure 14D:
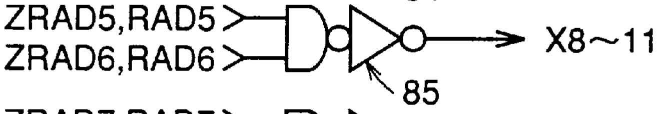
Figure 14E:
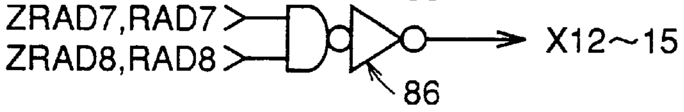
Figure 14F:
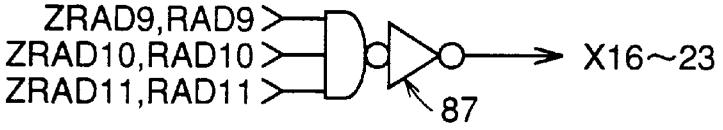

Operations of the ZPOR signal generation circuit are now described. When the power supply potential Vcc abruptly rises (time t1), the potential of the node N60 has a waveform in a time delay with respect to the power supply potential Vcc, as shown in FIG. 13B. When the power supply potential Vcc slowly changes (time t4), however, the potential of the node N60 has the same waveform as the power supply potential Vcc as described above.

If the power supply potential Vcc is lower than 2×Vth (Vth represents the threshold voltage of the N-channel MOS transistors 68 and 66), the N-channel MOS transistors 65 and 66 enter non-conducting states and the resistive element 71 charges the node N64 to the power supply potential Vcc, as shown in FIG. 13D. When the power supply potential Vcc exceeds 2×Vth, on the other hand; the N-channel MOS transistors 65 and 66 conduct to discharge the node N64 to a low level. Also when the power supply voltage Vcc slowly changes (time t4), therefore, the signal ZPOR of a waveform different from that of the power supply potential Vcc is obtained. When the power supply potential Vcc exceeds 2×Vth, the N-channel transistors 65 and 66 conduct and a current flows from the line of the power supply potential Vcc to that of the ground potential GND. In order to reduce this current for reducing power consumption, the resistive element 71 is set at a high resistance value. Therefore, abrupt reduction of the power supply voltage Vcc at a time t2 cannot be responded by only the signal generation circuit 64 and the resistive element 71.

Therefore, the signal generation circuit 67 is connected to the node N64. The node N68 remains at a high level despite the abrupt reduction of the power supply potential Vcc at the time t2. On the other hand, the-P-channel MOS transistor 70 conducts due to reduction of the gate potential thereof, the node N64 goes high and the signal ZPOR goes low.

It is apprehended that the P-channel MOS transistor 70 conducts due to a noise superposed on the power supply potential Vcc at a time t3 to set the signal ZPOR low. In this ZPOR generation circuit, however, the N-channel MOS transistors 65 and 66 conduct to maintain the node N64 at the low level so far as the power supply voltage Vcc is in excess of 2×Vth, whereby the signal ZPOR will not go low unless the power supply voltage Vcc drops below 2×Vth.

[Embodiment 6]

The number of lines must be reduced in order to reduce the chip area of a DRAM. An embodiment 6 of the present invention is adapted to reduce the number of lines.

FIGS. 14A to 14F are circuit diagrams showing the structure of a predecoder of a DRAM according to the embodiment 6 of the present invention in contrast with FIG. 29. Referring to FIGS. 14A to 14F, the predecoder includes AND gates 81 and 84 to 87 formed by NAND gates and invertors and inversion circuits 82 and 83 each formed by three invertors.

A signal RAD2 is inverted by the inversion circuit 82 to form a signal ZRADD2. A signal ZRAD2 is inverted by the inversion circuit 83 to form a signal RADD2.

The AND gate 81 is provided in correspondence to each of signals X0 to X3. Two of signals ZRAD0, RAD0, ZRAD1 and RAD1 are previously assigned to each AND gate 81. Each AND gate 81 responsively sets a corresponding signal X high when the previously assigned two signals go high.

Similarly, signals X4 to X7 are generated from signals ZRAD3, RAD3, ZRAD4 and RAD4. Signals X8 to X11 are generated from signals ZRAD5, RAD5, ZRAD6 and RAD6. Signals X12 to X15 are generated from signals ZRAD7, RAD7, ZRAD8 and RAD8. Block signals X16 to X23 are generated from signals ZRAD9, RAD9, . . . ZRAD11 and RAD11.

The signals X0 to X15 are decoded with the block signals X16 to X23 by a circuit similar to that shown in FIG. 30, to form local signals XD0 to XD15 respectively.

Figure 15:
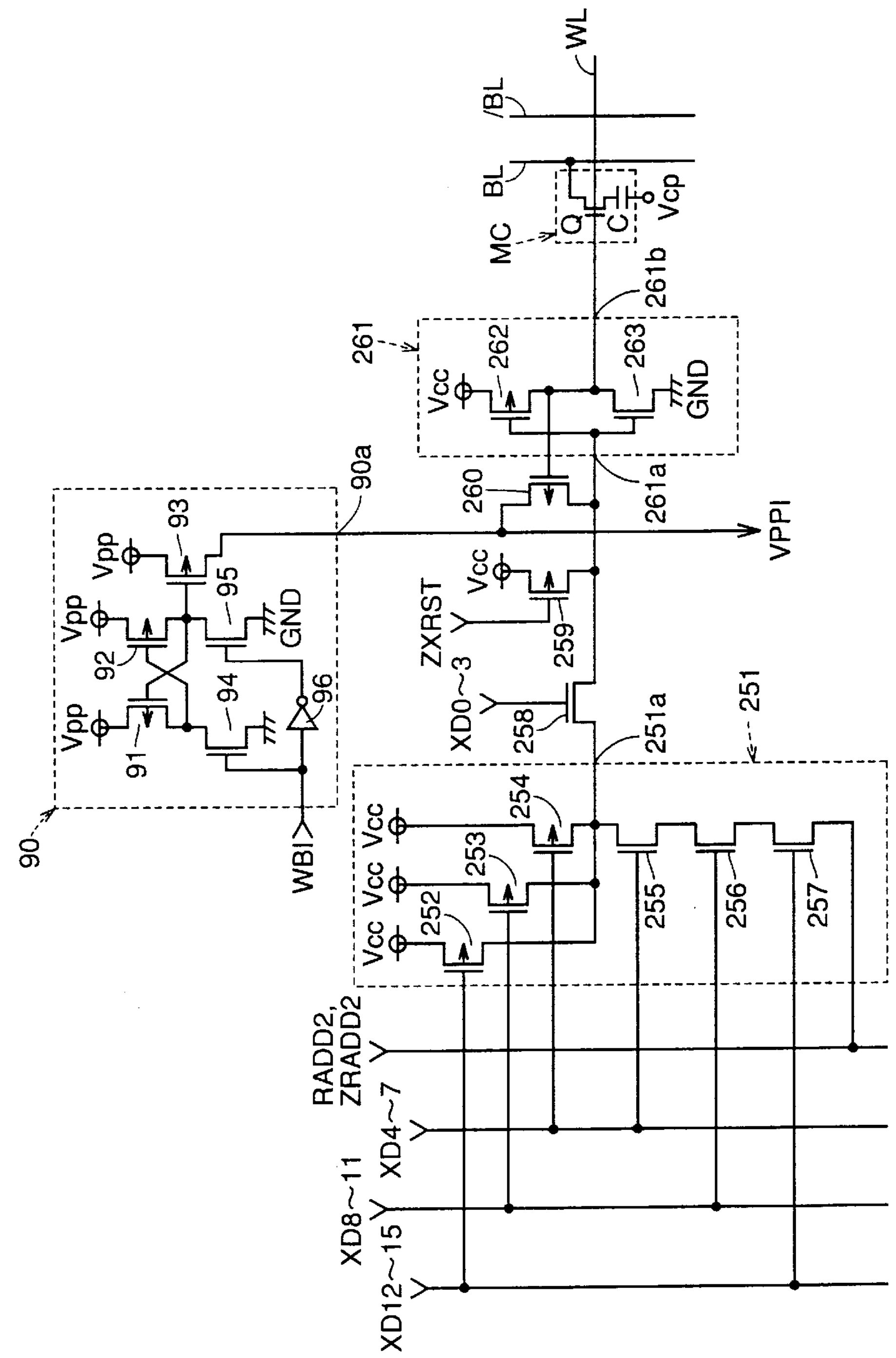
FIG. 15 is a circuit diagram showing the structure of a word line drive circuit of the DRAM shown in FIG. 14.
Figure 31:
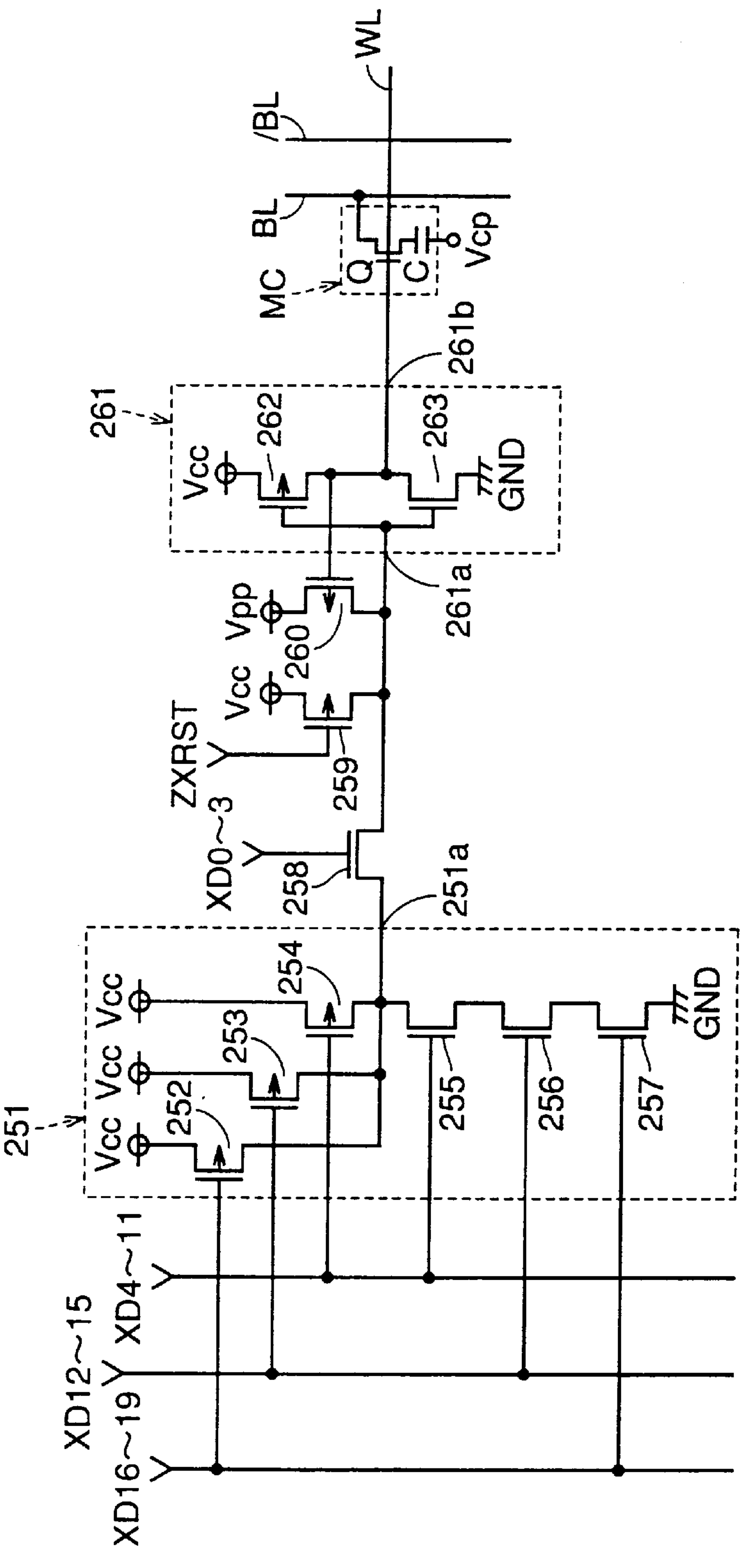
FIG. 31 is a circuit diagram showing the structure of a word line drive circuit of the DRAM shown in FIG. 16.

FIG. 15 is a circuit diagram showing the structure of a word line drive circuit for selecting the word line WL in response to address signals XD0 to XD15 in contrast with FIG. 31.

Referring to FIG. 15, the word line drive circuit is different from that shown in FIG. 31 in a point that an input signal for a NAND gate 251 is changed and that a VPPI signal generation circuit 90 is newly provided.

Gates of MOS transistors 252 and 257 included in the NAND gate 251 receive a signal (e.g., XD12) previously assigned to the corresponding word line WL among the address signals XD12 to XD15. Gates of MOS transistors 253 and 256 receive a signal (e.g., XD8) previously assigned to the corresponding word line WL among the address signals XD8 to XD11. Gates of MOS transistors 254 and 255 receive a signal (e.g., XD4) previously assigned to the corresponding word line WL among the address signals XD4 to XD7. A source of the MOS transistor 257 receives a signal (e.g., RADD2) previously assigned to the corresponding word line WL among address signals RADD2 and ZRADD2.

When the previously assigned signals XD12, XD8, XD4 and RADD2 go high, high, high and low respectively, an output node 251*a* of the NAND gate 251 goes low. When a previously assigned signal (e.g., XD0) among the signals XD0 to XD3 goes high, the N-channel MOS transistor 258 conducts and an output signal of the NAND gate 251 is inputted in an invertor 261 through the N-channel MOS transistor 258, so that the invertor 261 sets the corresponding word line WL high.

Therefore, this DRAM requires only 18 lines for transmitting the predecode signals XD0 to XD15, RADD2 and ZRADD2 as compared with the conventional DRAM requiring 20 lines for transmitting the predecode signals XD0 to XD19.

While all word lines WL must be simultaneously set high in order to reduce the time for a burn-in test, the ability of a driver for setting the signals RADD2 and ZRADD2 low must be increased if the source of a P-channel MOS transistor 260 is connected to a line of a step-up potential Vpp (see FIG. 31).

Therefore, this DRAM is further provided with a VPPI generation circuit 90 for stopping supply of the step-up potential Vpp to the P-channel MOS transistor 260 in the burn-in test.

The VPPI generation circuit 90 includes P-channel MOS transistors 91 to 93, N-channel MOS transistors 94 and 95 and an invertor 96. The MOS transistors 91 and 94 and the MOS transistors 92 and 95 are serially connected between lines of the step-up potential Vpp and a ground potential GND respectively. Gates of the P-channel MOS transistors 91 and 92 are connected to drains of the N-channel MOS transistors 95 and 94 respectively. A burn-in test signal WBI is directly inputted in the gate of the N-channel MOS transistor 94 and inputted in the gate of the N-channel MOS transistor 95 through the invertor 96. The P-channel MOS transistor 93 is connected between a line of the step-up potential Vpp and an output node 90*a*, and the gate thereof is connected to a drain of the N-channel MOS transistor 95. A source of the P-channel MOS transistor 260 is connected to the output node 90*a*.

In the burn-in test, the signal WBI goes high for activation, the MOS transistors 92 and 94 conduct, the MOS transistors 91, 93 and 95 enter non-conducting states, and the potential of the output node 90*a*, i.e., a signal VPPI enters a high impedance state. Therefore, supply of the step-up potential Vpp to the input node 261*a* of the invertor 261 is stopped and a driver for the signals RADD2 and ZRADD2 may have small ability.

In a general operation, the signal WBI goes low for inactivation, the MOS transistors 91, 93 and 95 conduct, the MOS transistors 92 and 94 enter non-conducting states, and the signal VPPI goes high. Thus, the input node 261*a* of the invertor 261 goes high, and the word line WL is fixed at a low level for inactivation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device being reset upon power supply, comprising:

a resistive element connected between a line of a power supply potential and a first node;

a discharge circuit connected between said first node and a line of a first potential for responsively conducting when the potential of said first node exceeds a predetermined potential level;

a logic circuit responsively outputting a reset signal for resetting said semiconductor memory device when the potential of said first node is higher than a predetermined level;

an RC filter including a resistive element and a capacitor connected between lines of said power supply potential and a second potential and a second node respectively; and a transistor connected between said second node and said first node and having an input electrode receiving said power supply potential for responsively conducting when said power supply potential drops by a predetermined voltage from the potential on said second node.

2. The semiconductor memory device according to claim 1, wherein each of the first and second potentials is a ground potential.

3. The semiconductor memory device according to claim 1, wherein said discharge circuit includes discharge transistors serially coupled between the first node and the line of the first potential, and the predetermined potential level is dependent on threshold voltages of the discharge transistors.

4. The semiconductor memory device according to claim 1, wherein said transistor is a P-channel MOS transistor.

5. The semiconductor memory device according to claim 4, wherein a back gate of said transistor is connected to the second node.

6. The semiconductor memory device according to claim 1, further comprising a signal generation circuit including a transistor connected between power supply and a third node, and a capacitor connected to the third node, wherein said logic circuit includes a logic gate generating the reset signal in response to the potentials of the first and third nodes.

* * * * *